United States Patent [19]

Uzumaki et al.

[11] Patent Number: 5,049,541
[45] Date of Patent: Sep. 17, 1991

[54] PROCESS FOR PREPARING SUPERCONDUCTOR

[75] Inventors: Takuya Uzumaki, Kawasaki; Kazunori Yamanaka, Sagamihara; Nobuo Kamehara, Isehara; Koichi Niwa, Tama, all of Japan

[73] Assignee: Fujitsu Limited, Kawasaki, Japan

[21] Appl. No.: 382,180

[22] Filed: Jul. 19, 1989

[30] Foreign Application Priority Data

Jul. 25, 1988 [JP] Japan ................................ 63-185015
Nov. 11, 1988 [JP] Japan ................................ 63-285125
Nov. 29, 1988 [JP] Japan ................................ 63-301635

[51] Int. Cl.$^5$ ...................... H01B 12/00; H01L 39/12
[52] U.S. Cl. ........................... 505/1; 505/782; 501/123; 252/521; 423/592; 423/618; 423/619; 423/635
[58] Field of Search ....................................... 505/188

[56] References Cited

PUBLICATIONS

Uota et al, "The effect of lead addition on superconductivity in Bismuth-Stromtium-calcium-copper oxide", Jpn. J. Appl. Phys, Part 2, 27(12), L2289-L2292 Dec. 1988.
Mizuno et al., "Superconductivity of $Bi_2Sr_2Ca_2Cu_3Pb_xO_y$ (x=0.2, 0.4, 0.6)" Jpn. J. Appl. Phy. vol. 27, #7, Jul. 1988, pp. L 1225-L1227.
Subramanian et al, "Crystal structure of the high-temperature superconductor $Tl_2Ba_2CaCU_2O_8$", Nature vol. 332 Mar. 31, 1988.
T. Uzumaki et al., "The Effect of $Ca_2PbO_4$ Addition on Superconductivity in a Bi-Sr-Cu-O System," Japanese Journal of Applied Physics, vol. 28, No. 1, Jan. 1989, pp. L75-L77.
M. Takano et al., "High-$T_c$ Phase Promoted and Stabilized in the Bi, Pb-Sr-Ca-Cu-O System," Japanese Journal of Applied Physics, vol. 27, No. 6, Jun. 1988, pp. L1041-L1043.
Japanese Journal of Applied Physics, "Superconductivity in the Bi-Sr-Ca-Cu-O System," vol. 26, No. 12, Dec. 1987, pp. L2080-L2081.
Japanese Journal of Applied Physics, "A New High $T_c$ Oxide Superconductor without a Rare Earth Element," vol. 27, No. 2 Feb. 1988, pp. L209-L210.
Nikki Electronics, Apr. 18, 1988 (No. 445), pp. 174-177.
Japanese Journal of Applied Physics, "Preparation of High-$T_c$ Tl-Ba-Ca-Cu-O Superconductors," vol. 27, No. 5, May 1988, pp. L804-L806.
Japanese Journal of Applied Physics, "High-$T_c$ Phase Promoted and Stabilized in the Bi, Pb-Sr-Ca-Cu-O System," vol. 27, No. 6, May 1988, pp. L1041-L1043.
Japanese Journal of Applied Physics, "Crystal Phases of $BiSrCaCu_2O_x$ Heat Treated in a Vacuum-Sealed System," vol. 27 No. 8, Aug. 1988, pp. L1429-L1431.
Japanese Journal of Applied Physics, "Effect of Oxygen Content and Sr/Ca Ratio on Superconducting Properties in $Bi_2Sr_{2-x}Ca_1+Cu_2O_{8+\delta}$," vol. 27, No. 8, Aug. 1988, pp. L1442-L1444.
Japanese Journal of Applied Physics, "Superconductivity at 100 K in Bi-Pb-Sr-Ca-Cu-O," vol. 27, No. 8, Aug. 1988, pp. L1445-L1448.
Japanese Journal of Applied Physics, "Single-Crystal X-Ray and Magnetization Study of the 106 K Bi-Sr-Ca-Cu-O Superconductor," vol. 27, No. 8, Aug. 1988, pp. L1463-L1466.

(List continued on next page.)

Primary Examiner—William R. Dixon, Jr.
Assistant Examiner—C. Melissa Bonner
Attorney, Agent, or Firm—Staas & Halsey

[57] ABSTRACT

Superconductors of the Bi-Pb-Sr-Ca-Cu-O system and Tl-Pb-Ba-Ca-Cu-O system having a high Tc phase (about 110K and about 125K, respectively, or more) at a high proportion are obtained by adding a calcium compound which forms CaO and a liquid phase at a temperature for firing the superconductors, e.g., $Ca_2PbO_x$ (x=3 or 4); or by starting form a composition represented by the formula: $Bi_2Pb_{(n-1)/2}Sr_2Ca_nCu_{n+1}O_b$, or $Tl_2Pb_{(n-1)/2}Ba_2Ca_nCu_{n+1}O_b$ where $2 \leq n \leq 10$, $5 \leq b \leq 40.5$, i.e., at a ratio of Ca:Pb=2:1.

16 Claims, 21 Drawing Sheets

PHASE DIAGRAM OF CaO-PbO SYSTEM

OTHER PUBLICATIONS

Japanese Journal of Applied Physics, "Properties of Pb-Doped Bi-Sr-Ca-Cu-O Superconductors," vol. 27, No. 8, Aug. 1988, pp. L1479-L1479.

Japanese Journal of Applied Physics, "Preparation of High-$T_c$ Phase of Bi-Sr-Ca-Cu-O Superconductor," vol. 27, No. 8, Aug. 1988, pp. L1479-L1479.

Japanese Journal of Applied Physics, "Formation of a 100 K Superconducting Bi(Pb)-Sr-Ca-Cu-O Film by a Spray Pyrolysis", vol. 27, No. 9, Sep. 1988, pp. L1669-L1671.

Japanese Journal of Applied Physics, "Reproducible Processin for High-$T_c$ Superconducting Ti-Ba-Ca-Cu-O Phases," vol. 27, No. 9, Sep. 1988, pp. L1672-L1675.

7th Symposium on Future Electron Devices, "Research on Superconducting Electron Devices at Electrotechnical Laboratory (Invited)," Nov. 1-2, 1988, Tokyo, Japan, pp. 25-30.

Itoh et al, Japanese Journal of Applied Physics, "Formation and Degradation of the 120 K $T_c$ Phase in the Tl-Pb-Sr-Ca-Cu-O System," vol. 28, No. 4, Apr. 1989, pp. L591-594.

LOW Tc PHASE

HIGH Tc PHASE

PHASE DIAGRAM OF CaO−PbO SYSTEM

PHASE DIAGRAM OF CaCl$_2$−CaO SYSTEM

841°C, 99 h

841°C, 200 h

Bi-Sr-Ca-Cu-O SYSTEM WITHOUT ADDITIVE

CaPbO BULK

SAMPLE ADDED WITH Ca₂PbO₄

SAMPLE ADDED WITH Ca₂PbO₄

Bi-Sr-Cu-O SYSTEM ADDED WITH Ca₂PbO₄

Bi-Sr-Cu-O SYSTEM ADDED WITH Ca₂PbO₄

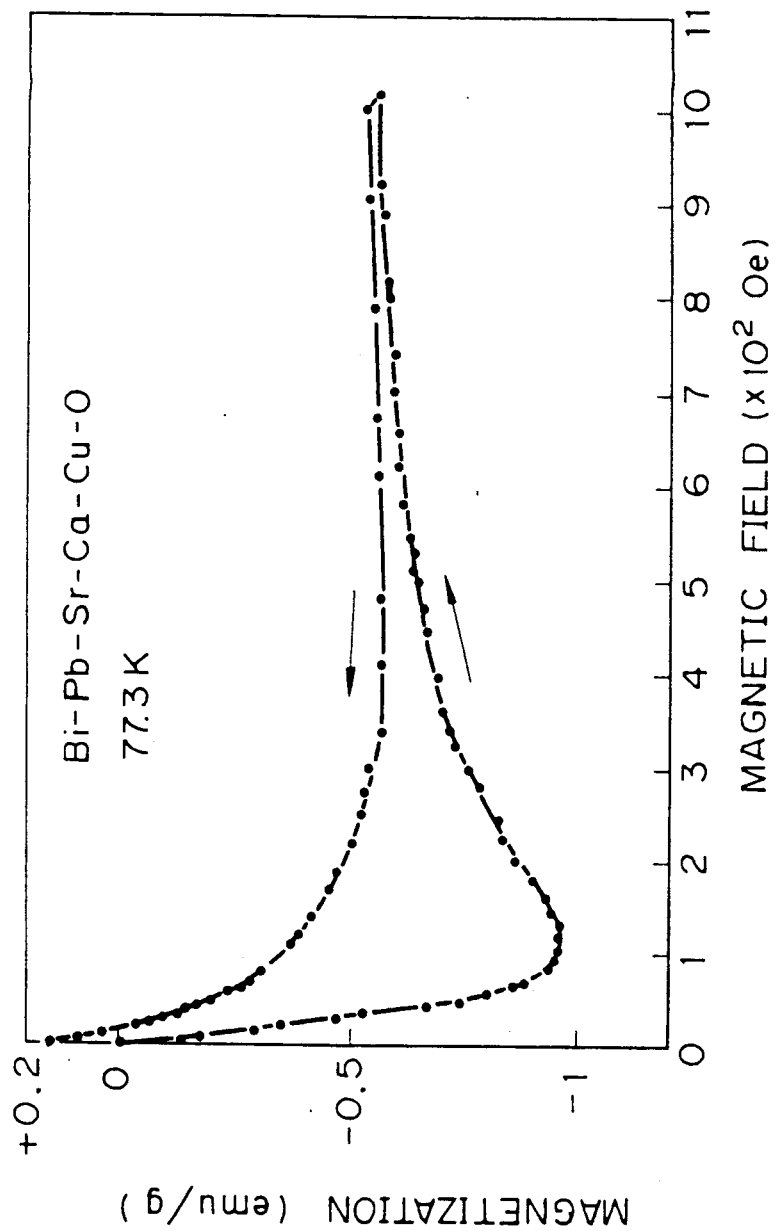

$Bi_2Pb_1Sr_2Ca_3Cu_4O_y$ $Bi_2Pb_1Sr_2Ca_3Cu_4O_y$ $Bi_2Pb_{1.5}Sr_2Ca_4Cu_5O_y$ $Bi_2Pb_{1.5}Sr_2Ca_4Cu_5O_y$

PROCESS FOR PREPARING SUPERCONDUCTOR

BACKGROUND OF THE INVENTION

1. Field of the Invention

The present invention relates to a process for preparing a superconductor. More specifically, the present invention relates to a process for preparing a superconductor of Bi-(Pb)-Sr-Ca-Cu-0 system or Tl-Ba-Ca-Cu-0 system in a shorter firing time.

2. Description of the Related Art

High temperature superconductive materials exhibiting superconductivity at a temperature of liquid nitrogen are under intensive investigation and the development of the utilization of these materials is proceeding rapidly. Particularly, high temperature superconductive materials exhibiting superconductivity at above 100 K are under investigation and development, since they allow a wide temperature margin for liquid nitrogen application, theoretically high critical current density Jc and critical magnetic field Hc, and are expected to provide superconductive materials with a higher Tc which can be utilized as thin films and wiring.

Y-Ba-Cu-0 system superconductive materials have a high critical temperature of about 90 K but are chemically unstable, resulting in a loss of the superconductivity by a reaction with $H_2O$, $CO_2$, etc., when placed in air, which causes problems in the utilization thereof.

As superconductive materials having a critical temperature higher than 100 K, Bi-Sr-Ca-Cu-0 system and Tl-Ba-Ca-Cu-0 system superconductor materials are known (J.J.A.P. vol. 27, No. 2, 1988, pp 209-210; NIKKEI ELECTRONICS 1988.4.18 (No. 55) pp 175-177). These Bi-system and Tl-system superconductive materials are not susceptible to water and oxygen, are easily made and processed, and are not source-limited since they do not contain a rare earth element. Nevertheless, the Bi-system superconductive materials have a low Tc phase of about 80 K and a high Tc phase of about 110k, and the Tl-system superconductive materials have a low Tc phase of about 105 K and a high Tc phase of about 125 K: Note, the high Tc phases of these materials are not formed individually.

It is known in the prior art that the proportion of the high Tc phase of the Bi-Sr-Ca-Cu-0 system superconductive material can be increased by adding PbO (NIKKEI SUPERCONDUCTOR 1988.5.16, pp 2-3). In this process, a part of Bi is replaced by Pb, salts of oxalates in a predetermined ratio (Bi:Pb:Sr:Ca:Cu:0 =0.7:0.3:1.0:1.0:1.8) are used as starting materials, and calcination at 800° C for 12 hours and firing at 845° C. for 240 hours are carried out. At the calcination stage, the formation of the low Tc phase must be avoided and intermediate products of $Ca_2PbO_{x(x=3\ or\ 4)}$, $Ca_xSr_{3-x}Cu_5O_y$, $Bi_2Sr_2Cu_1O_x$ produced, and firing is conducted at 845° C. while the temperature is kept at not higher than 880° C. It is disclosed that almost all of the Pb is lost during the firing; Pb creates a reaction route when forming the high Tc phase and stabilize the formed high Tc phase, but this process disadvantageously requires a long firing time of 240 hours.

Also it was reported by researchers of Kyoto University, Mie University, and Toda Kogyo that a Bi-system bulk with a high Tc phase was obtained by adding Pb, and by researchers of Osaka University and Daikin that an almost single-phased sample is attained by adding Pb to the Bi system. Samples are prepared by two methods, a codecomposition of nitrates and a solid reaction, both of which produce a superconductive material having a high Tc phase of 107.5 K, and a composition ratio of Bi:Pb:Sr:Ca:Cu =0.8:0.2:0.8:1.0:1.4. This process utilizes firing in a low pressure oxygen atmosphere, by which the melting point of the material is lowered and the temperature range for the formation of the high Tc phase is broadened. The firing is conducted at 842° C for 80 hours (solid reaction method) and at 828° C for 36 hours. In both methods, variation of the oxygen pressure allows firing at 800°-820° C., and it is disclosed that, in the nitrate codecomposition method, firing at 828° C for 36 hours produces the high Tc phase at a higher rate and is an example of a short time firing (Trigger 88-8, p 91-92, 1988.7.8).

A Bi-Sr-Cu-0 system superconductive material having a Tc of 7 K was found by Akimitsu et al (Jpn. J. Appl. Phys. 26, 1987, L2080) or Michel (et al Z. Phys. B68 (1987) 421).

Maeda et al found a high Tc phase Bi-Sr-Ca-Cu-0 system superconductive material (Jpn. J. Appl. Phys. 27, 1988, L209), having three superconductive phases with a Tc of 7 K corresponding to n =1, a Tc of 80 K corresponding to n =2 and a Tc of 105 K corresponding to n=3, in $Bi_2Sr_2Ca_{n-1}Cu_nO_x$. With increase of n from 1 to 3, the number of the CuO layers in the crystal structure is increased and the c axis is varied from 24 AÅ to 30 AÅ to 37 AÅ.

Since the single high Tc phases of the above superconductive materials are not synthesized, an investigation of the high Tc phases has not been reported.

Takano et al reported that the proportion of the high Tc phase of the Bi-system superconductive material was increased by substituting Pb for Bi (Jpn. J. Appl. Physics 27, 1988, L1041), but the role of Pb was not clarified.

The purpose of the present invention is to provide a process for preparing a superconductive material with an increased proportion of a high Tc phase in a shorter firing time in comparison with the prior art method of adding PbO.

SUMMARY OF THE INVENTION

The above purpose of the invention is attained by a process for preparing a superconductor, comprising the steps of: preparing a first material in the form of a powder mixture or sintered mass having a composition represented by the formula (I):

$$Bi_{u'}Pb_{v'}Sr_{w'}Ca_{x'}Cu_{y'}O_{z'} \tag{I}$$

where $1 \leq u' \leq 3, 0 \leq v' \leq 1, 1 \leq w' \leq 3, 0 \leq x' \leq 12, 1 \leq y' \leq 12, 3 \leq z' \leq 39.5$; adding to the first material a calcium compound which forms a mixed phase of CaO and a liquid phase, at a temperature not higher than 900° C.; and firing the resulting mixture of the first material and the calcium compound at a temperature not higher than 900° C. to obtain a superconductor represented by the formula (II):

$$Bi_uPb_vSr_wCa_xCu_yO_z \tag{II}$$

where $1 \leq u \leq 3, 0 \leq v \leq 1, 1 \leq w \leq 2, 2 \leq x \leq 10, 3 \leq y \leq 11, 6 \leq z \leq 35$.

The same process is applicable to the Tl-system superconductor, and thus there is also provided a process for preparing a superconductor, comprising the steps of: preparing a first material in the form of powder mixture or sintered mass having a composition represented by the formula (III):

$$Tl_{u'}Pb_{v'}Ba_{w'}Ca_{x'}Cu_{y'}O_{z'} \quad (III)$$

where $1 \leq u' \leq 3, 0 \leq v' \leq 1, 1 \leq w' \leq 3, 0 \leq x' \leq 12, 1 \leq y' \leq 12, 3 \leq z' \leq 39.5$; adding to the first material calcium compound which forms a mixed phase of CaO and a liquid phase, at a temperature not higher than 900° C.; and firing the resulting mixture of the first material and the calcium compound at a temperature not higher than 900° C. to obtain a superconductor represented by the formula (IV):

$$Tl_uPb_vBa_wCa_xCu_yO_z \quad (IV)$$

where $1 \leq u \leq 3, 0 \leq v \leq 1, 1 \leq w \leq 2, 2 \leq x \leq 10, 3 \leq y \leq 11, 6 \leq z \leq 35$.

In preferred embodiments of the invention, $y = x + 1$; $1.5 \leq u' \leq 2.5, 0 \leq v' \leq 1, 1.5 \leq w' \leq 2.5, 0 \leq x' \leq 4, 3 \leq y' \leq 8, 3 \leq z' \leq 25$; more preferably, $1.5 \leq u' \leq 2.5, 0 \leq v' \leq 0.5, 1.5 \leq w' \leq 25, 1.0 \leq x' \leq 2.0, 3.0 \leq y' \leq 4.0, 5.0 \leq z' \leq 17.0$; the calcium compound is selected from the group consisting of $Ca_2PbO_4, Ca_2PbO_3, CaCl_2,$ and $Ca_3OCl_4$ $(CaO.2CaCl_2)$; the calcium compound is added in an amount of 10-50 wt %, more preferably 10 to 20 wt% of the first material; the firing temperature is 750°-880° C., more preferably 840°-850° C. (higher that the temperature for forming a liquid phase). The reason why $3 \leq y \leq 11$, is to obtain a number of CuO layers of 3 to 11 between Bi2O2, and the reason why $2 \leq x \leq 10$ is that Ca is present between the CuO layers.(FIG. 1A-FIG. 1C) Since a superconductive material in which Bi or Tl is replaced by Pb is known, the range $0 \leq v \leq 1$ is stated, and since it is assumed that the composition may be deviated from $Bi_2Sr_2Ca_2Cu_3O_z$ or $Tl_2Ba_2Ca_2Cu_3O_z$, the range $1 < = w < = 2$ is stated.

According to the present invention, there is also provided a process for preparing a superconductor by firing a mixture of starting materials having a total composition as oxides represented by the formula (V):

$$Bi_2Pb_{(n-1)/2}Sr_2Ca_nCu_{n+1}O_b \quad (V)$$

where $2 < = n < = 10, 9 < = b < = .5$, at a temperature of 750°- 880° C.; and a process for preparing a superconductor by firing a mixture of starting materials having a total composition as oxides represented by the formula (VI):

$$Tl_2Pb_{(n-1)/2}Ba_2Ca_nCu_{n+1}O_b \quad (VI)$$

where $2 \leq n \leq 10, 9 \leq b \leq 40.5$, at a temperature of 750°-900° C.

By these processes, superconductive materials represented by the following formula (VII):

$$Bi_2Pb_2Sr_2Ca_aCu_{a+1}O_{b'} \quad (VII)$$

or, superconductive materials represented by the following formula (VIII):

$$Tl_2Pb_vBa_2Ca_aCu_{a+1}O_{b'} \quad (VIII)$$

where $2 \leq a \leq 10, 0 \leq v \leq 1, 8.5 \leq b' \leq 31.5$, in which Pb may be contained in part, are obtained. The composition of the starting materials is selected to have a ratio of $Ca:Pb = n:(n-1)/2$, since the mole ratio of Ca and Pb has a close relationship to the formation of high Tc phases. When PbO is added to Bi-Sr-Ca-Cu-0 system or Tl-Ba-Ca-Cu-0 system superconductor, Pb is bound with Ca to form $Ca_2PbO_4$ at 750° C. or lower, which is separated into CaO and a liquid phase at 822° C. It is considered that a high Tc phase is formed by a reaction between a low Tc phase and CaO in the liquid phase. To form a high Tc phase in a short firing time, the low Tc phase and $Ca_2PbO_4$ must be formed at 800° C. or above. For the formation of, 2 moles of Ca are required to 1 mole of Pb, and therefore, PbO should be added in a ratio of $Ca:Pb = n:(n-1)/2$. The firing temperature of 750°-880° C. or 750°-900° C. is selected because high and low Tc phases are not formed at a temperature of 750° C. or lower, and the superconductor is fused at a temperature higher than 880° C. (Bi-System) or 900° C. (Tl-System). The reason why $2 \leq n \leq 10$ is to obtain a number of CuO layers of 3 to 11 between the $Bi_2O_2$ layers as before.

The firing temperature range of 750 to 900° C in the case of the Tl-system superconductor is selected for reasons similar to those given above.

BRIEF DESCRIPTION OF THE DRAWINGS

FIG. 15 shows the magnetization curve of the sample measured at 77.3 K in Example 4.

DESCRIPTION OF THE PREFERRED EMBODIMENTS

Figure 1A:
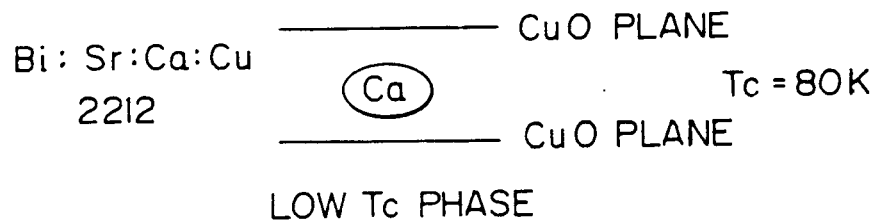
FIGS. 1A to 1C are schematic views of the crystal structure of superconductors.
Figure 1B:
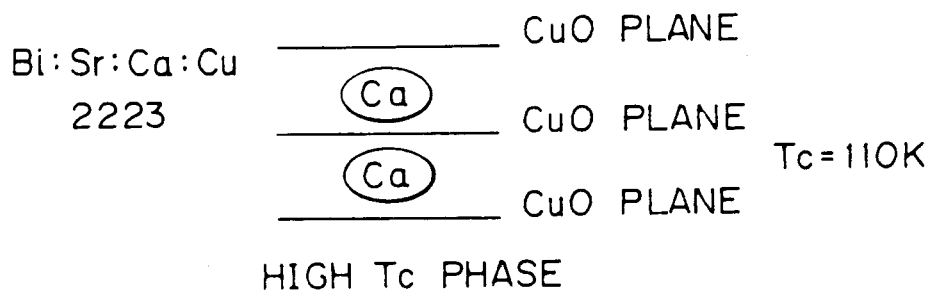
Figure 1C:
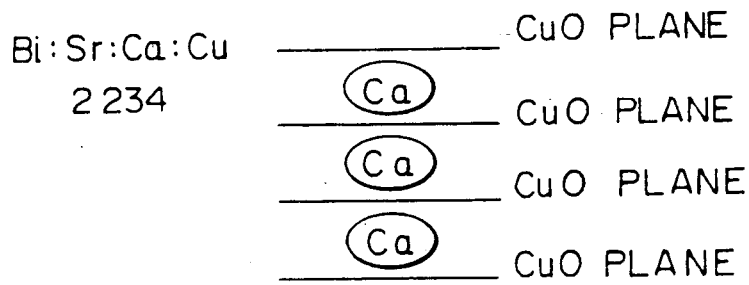

It is known that the critical temperature of Bi-system superconductors is increased with an increase of Cuo layers between $Bi_2O_2$ layers in the crystal lattice. When the number of CuO layers between the $Bi_2O_2$ layers is one, the critical temperature Tc is 7°-22° C.; when two, the Tc is about 80° C.; and when three, the Tc is about 110 K. The crystal structures of such superconductors are illustrated in FIG. 1. Ca is sandwiched between the CuO layers between the $Bi_2O_2$ layers, and, therefore, a crystal structure having many CuO layers requires a correspondingly high content of Cu and Ca. A liquid state is advantageous when supplying Ca to the crystal structure, due to an easy diffusion of Ca thereby. To accomplish this, the present invention uses a calcium compound forming CaO and a liquid phase at a temperature adjacent to, but preferably lower than, the melting point of the superconductor at which temperature firing can be carried out. The preferable firing temperature is thus about 750°-880° C. and the calcium compound preferably forms a liquid phase at 900° C. or lower. Such calcium compounds include $Ca_2PbO_4$ ($Ca_2PbO_3$), $CaCl_2$, $Ca_3OCl_4$, etc.

The same is applicable for Tl-system superconductors, although the preferable firing temperature is about 750°-900° C. and the calcium compound preferably forms a liquid phase at 900° C. or lower.

Figure 2:
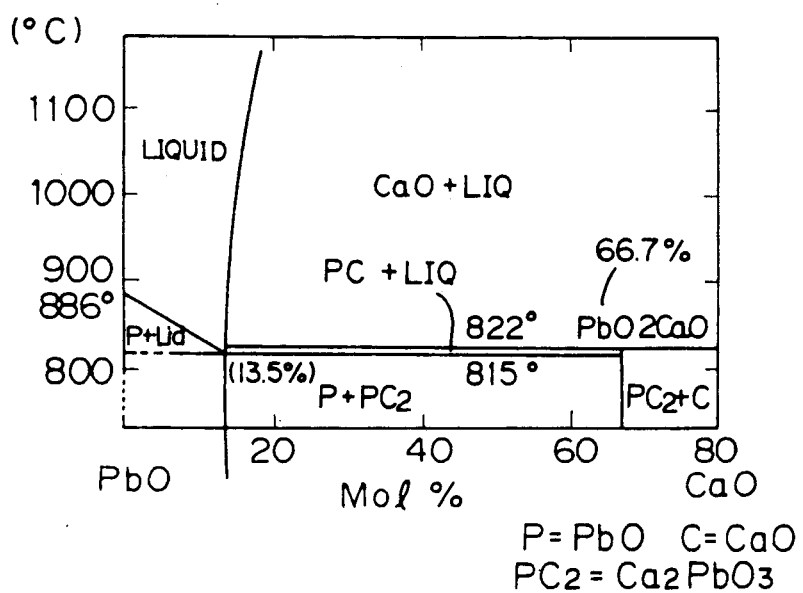
FIG. 2 is a phase diagram of the CaO-PbO system.
Figure 3:
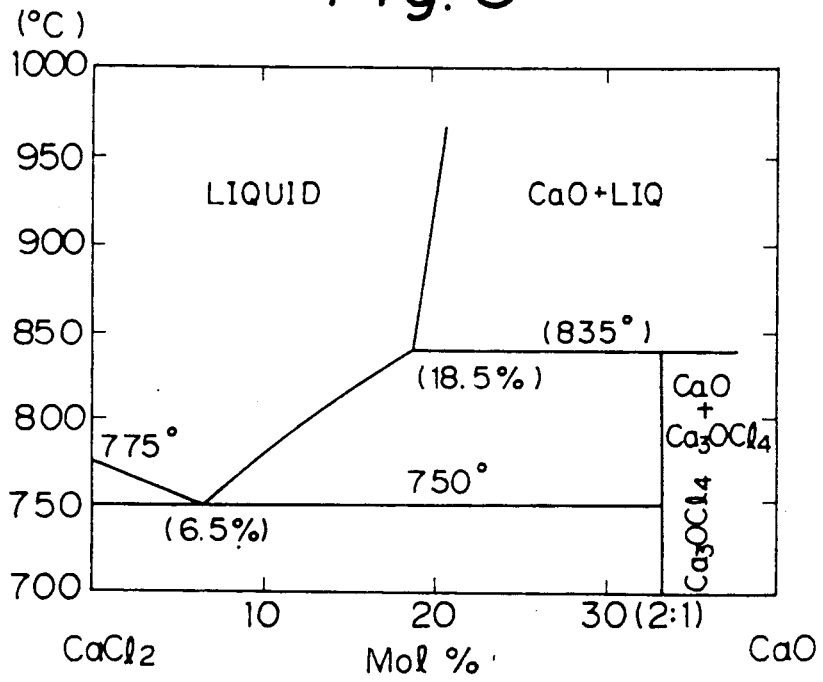
FIG. 3 is a phase diagram of the $CaCl_2$-CaO system.
Figure 4A:
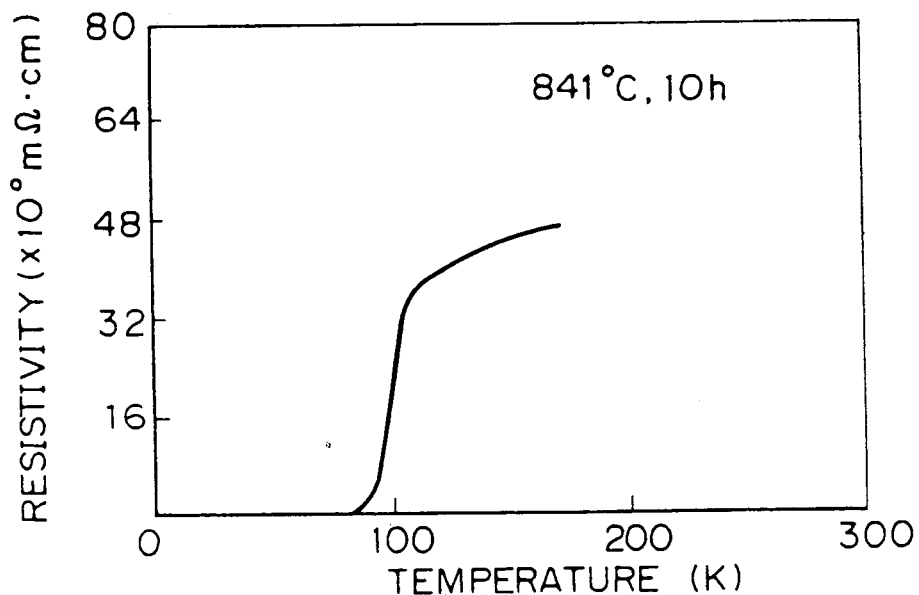
FIGS. 4A to 4D show electric resistance depending on the temperature of samples to which PbO is added in the prior art.
Figure 4B:
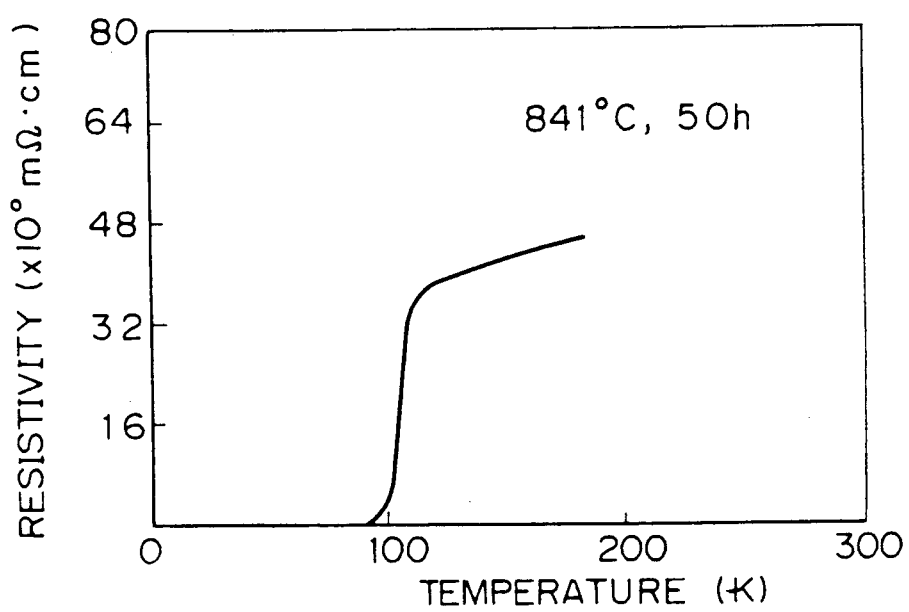
Figure 4C:
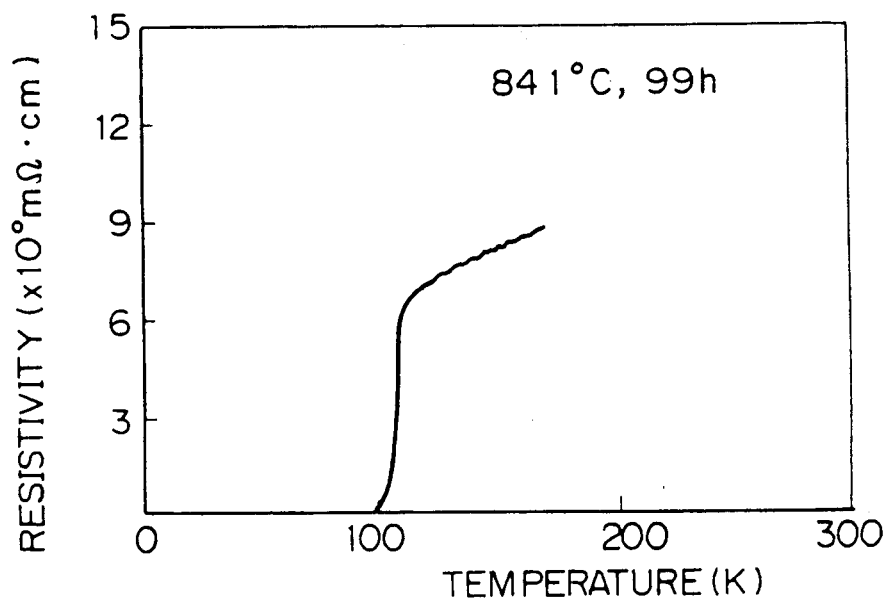
Figure 4D:
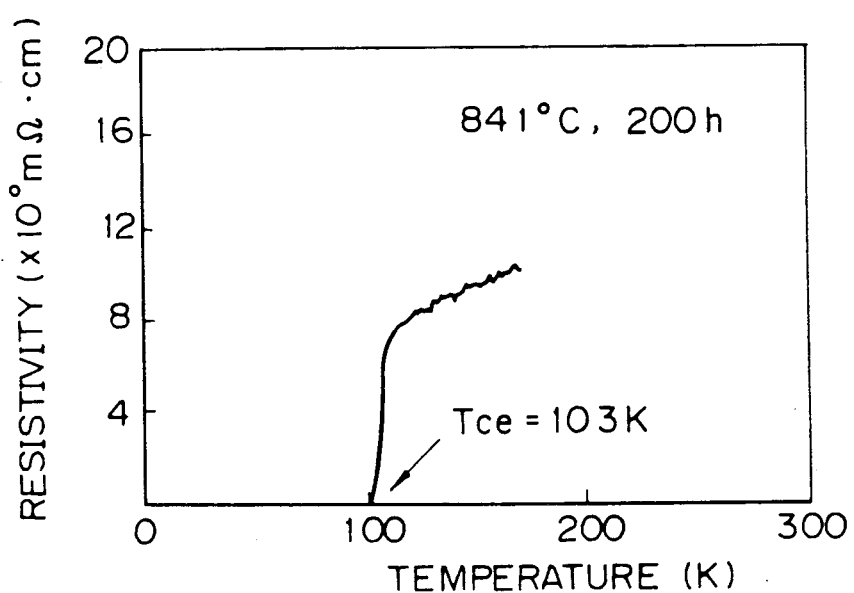
Figure 5A:
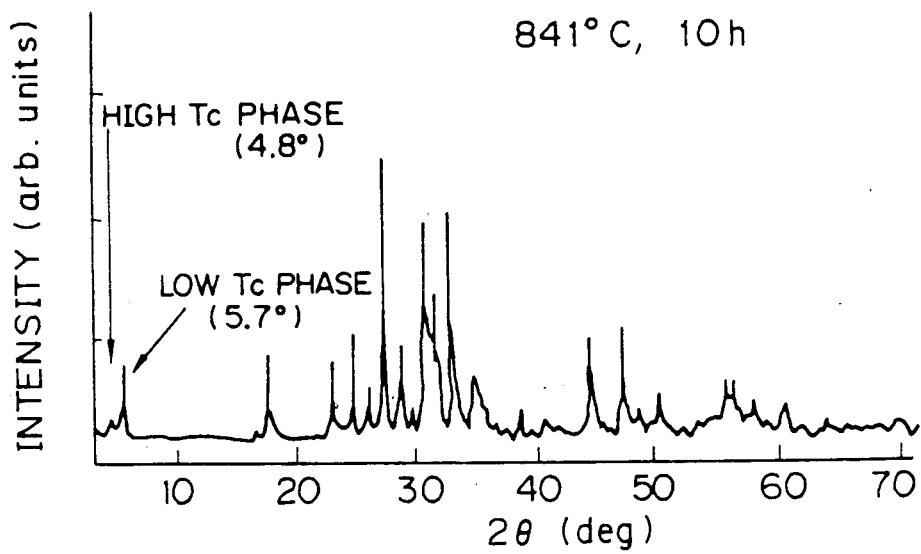
FIGS. 5A to 5D show X-ray diffraction patterns of samples to which PbO is added in the prior art.
Figure 5B:
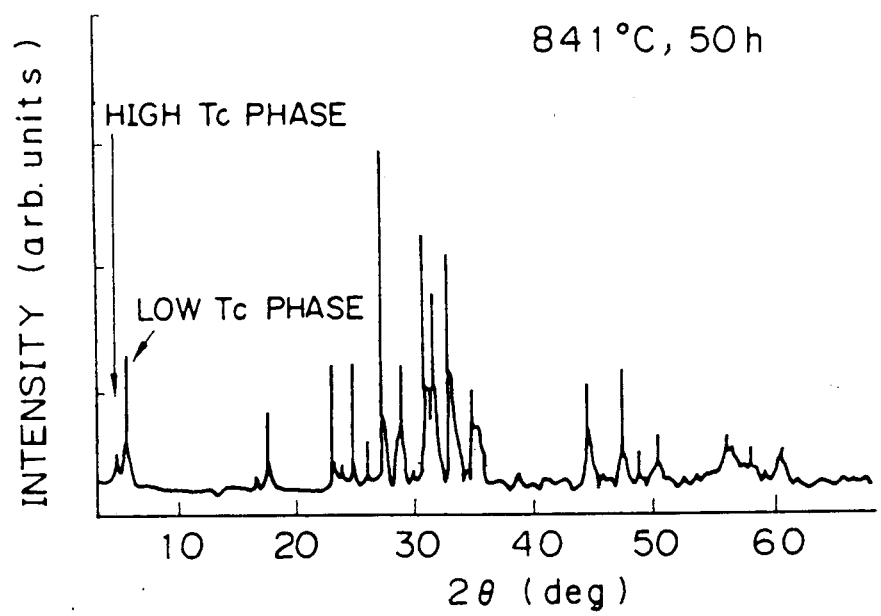
Figure 5C:
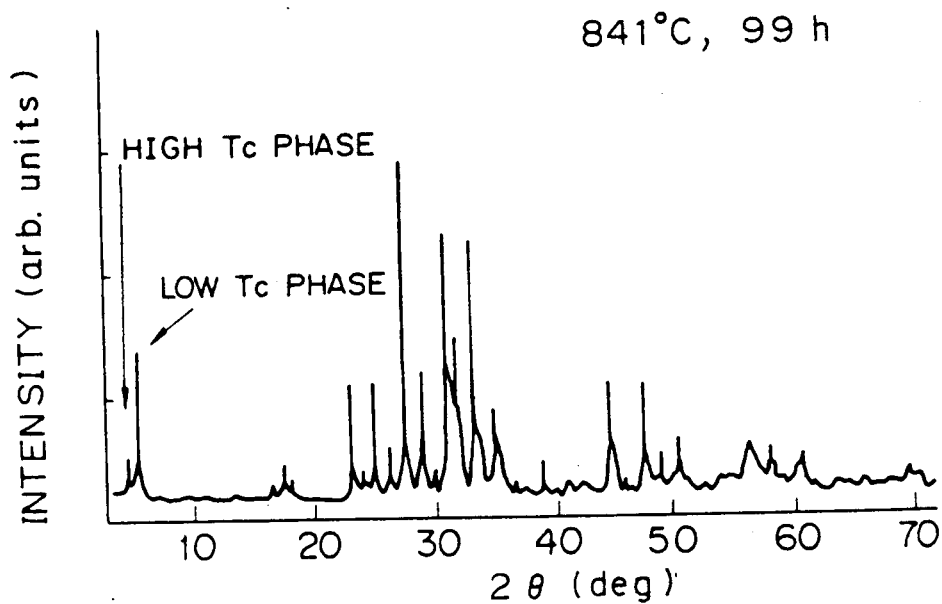
Figure 5D:
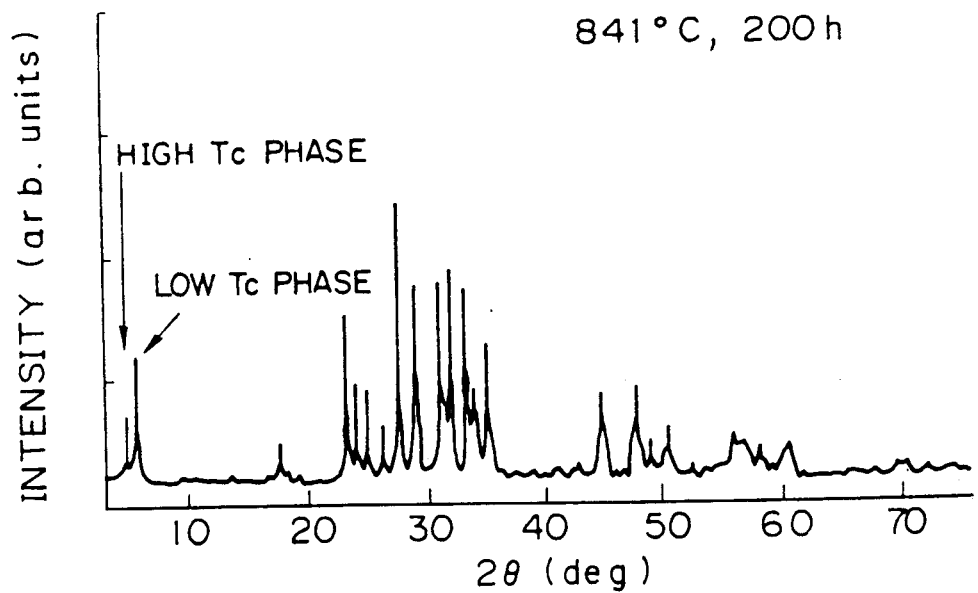

FIGS. 2 and 3 show phase diagrams of calcium compounds having such a preferable temperature range for forming CaO and a liquid phase. FIG. 2 shows a phase diagram of the CaO-PbO system: where when the CaO is more than 13.5 mole% (eutectic point), a CaO+Liq (liquid) phase is formed at 822° C. or higher; where it is more than 13.5 mole% to less than 66.7 mole %, a $PC_2(Ca_2PbO_3)$+Liq (liquid) phase is formed at a temperature lower than 822° C and higher than 815° C and an eutectic crystal $P+PC_2$ (Ca ) crystal mixture is formed at a temperature lower than 815° C; and where it is more than 66.7 mole%, a CaO+Liq (liquid) phase is formed at 822° C. or higher and a crystal mixture of $Ca_2PbO_3$+CaO is formed at temperature lower than 822° C.

FIG. 3 shows a phase diagram of the $CaO-CaCl_2$ system: where, when the CaO is more than 18.5 mole %, a CaO+Liq (liquid) phase is formed at 835° C. or higher. (By the way, where when the CaO is more than 18.5 mole % to less than 33.3 mole % and at a temperature higher than 750° C. and lower than 835° C., a $Ca_3OCl_4$+Liq (liquid) phase is formed.) Therefore, by using a composition of the $CaO-CaCl_2$ system having 18.5 mole % or more of CaO. a CaO+Liq (liquid) phase can be formed at 835° C. or higher.

EXAMPLE 1 (COMPARATIVE)

The starting materials were $Bi_2O_3$, $SrCO_3$, CaO, CuO, and PbO, having a more than 99.9% in purity und a 2 to 3 μm particle size. These materials were weighed at a ratio of Bi:Sr:Ca:Pb:Cu =0.7:1:1:0.3:1.8, mixed and milled and then shaped under a pressure of 200 MPa and fired in air at 841° C. The firing time was varied to 10, 50, 99, and 200 hours.

The electrical characteristics of the resulting Bi-system superconductors were measured and the X-ray diffractions thereof were also examined. FIGS. 4A to 4D show the electrical characteristics and FIGS. 5A to 5D show the X-ray diffractions of the samples fired for 10, 50, 99, and 200 hours, respectively. It is seen in FIGS. 4A to 4D that the $Tc_{end}$ was rised with an increase of the firing time. In FIGS. 5A to 5D, the peak at $2\theta=5.7$ (c axis: 30 AÅ) corresponds to the (002) plane of the low Tc phase and the peak at $2\theta=4.8$ (c axis: 37AÅ) corresponds to the (0 0 2) plane of the high Tc phase. It is seen in FIGS. 5A to 5D that the peak of the (200) plane of the high Tc phase was strengthened with an increased of the firing time. This corresponds to the above increase of the $Tc_{end}$ in FIGS. 4A to 4D It is seen from the X-ray diffraction pattern that, even if fired for 200 hours, the proportion of the high Tc phase is lower than that of the low Tc phase.

EXAMPLE 2 (ADDOTOPM PF $Ca_2PbO_4$ to Bi-Sr-Ca-Cu-O SYSTEM

Figure 6:
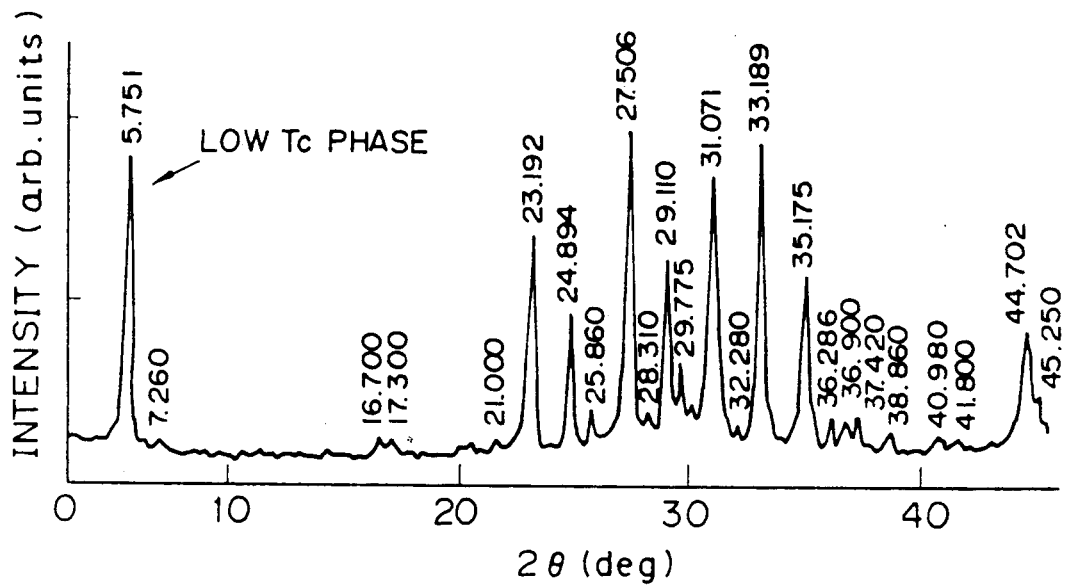
FIG. 6 shows an X-ray diffraction pattern of the sample without an additive, as a Comparative Example.

For comparison, starting materials similar &o those in Example 1 were weighed in a ratio of Bi:Sr:Ca:Cu =2:2:2:3, mixed, milled and then shaped under a pressure of 200 Mpa, followed by firing in air a& 841° C for 9 hours. The powder X-ray diffraction of the resulting sample is shown in FIG. 6, in which the peak at $2\theta=5.751°$ corresponds to the (002) plan e of $Bi_2Sr_2CaCu_2O_z$ (low Tc phase) and a high Tc phase having a peak at $2\theta=4.8°$ is not formed.

Figure 7:
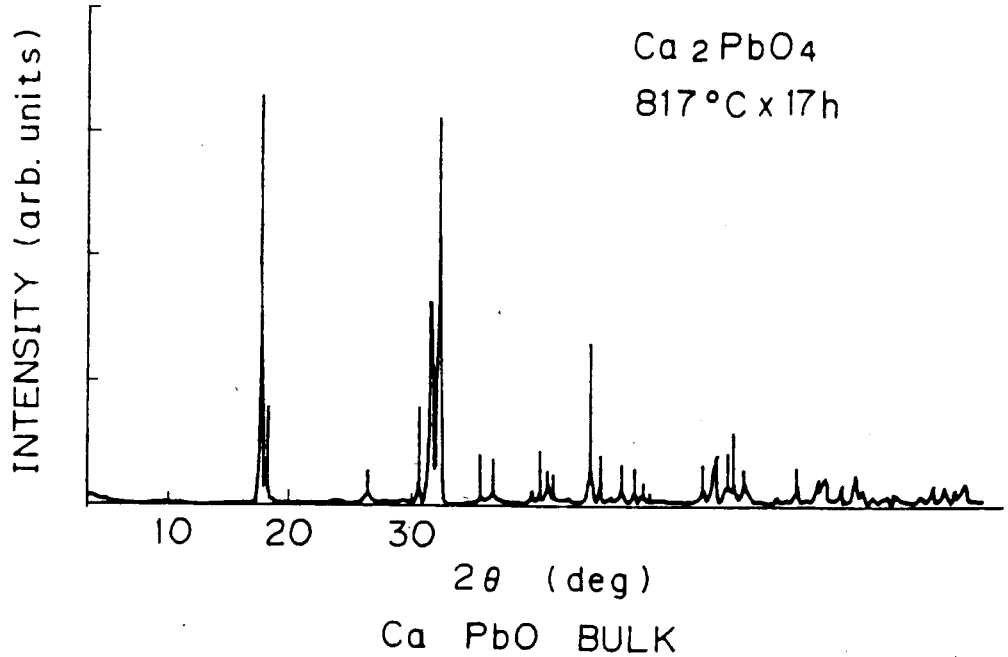
FIG. 7 shows an X-ray diffraction pattern of $Ca_2PbO_x$ prepared by firing in air at 817° C. for 17 hours.

Next, the above sample (fired) was ground, 35 wt% $Ca_2PbO_4$ was added, mixed, milled and then shaped under a pressure of 200 MPa, followed by firing in air at 841° C. for 30 hours. The $Ca_2PbO_4$ used was prepared by firing in air at 817° C. for 17 hours. The powder X-ray diffraction pattern of the $Ca_2PbO_4$ is shown in FIG. 7. Although in the phase diagram of CaO-PbO system shown in FIG. 2, $PC_2=PbO\cdot2CaO$, i.e., $Ca_2PbO_3$, the above added material, prepared by firing a mixture of CaO and PbO with a ratio of Ca:Pb =2:1 in air at 817° C for 17hours, was identified as $Ca_2PbO_4$ by X-ray diffraction of the fired material with the ASTM card. In the present invention, both and $Ca_2PbO_4$ and $Ca_2PbO_3$ may be used since valence electrons of Pb are susceptible.

Figure 8:
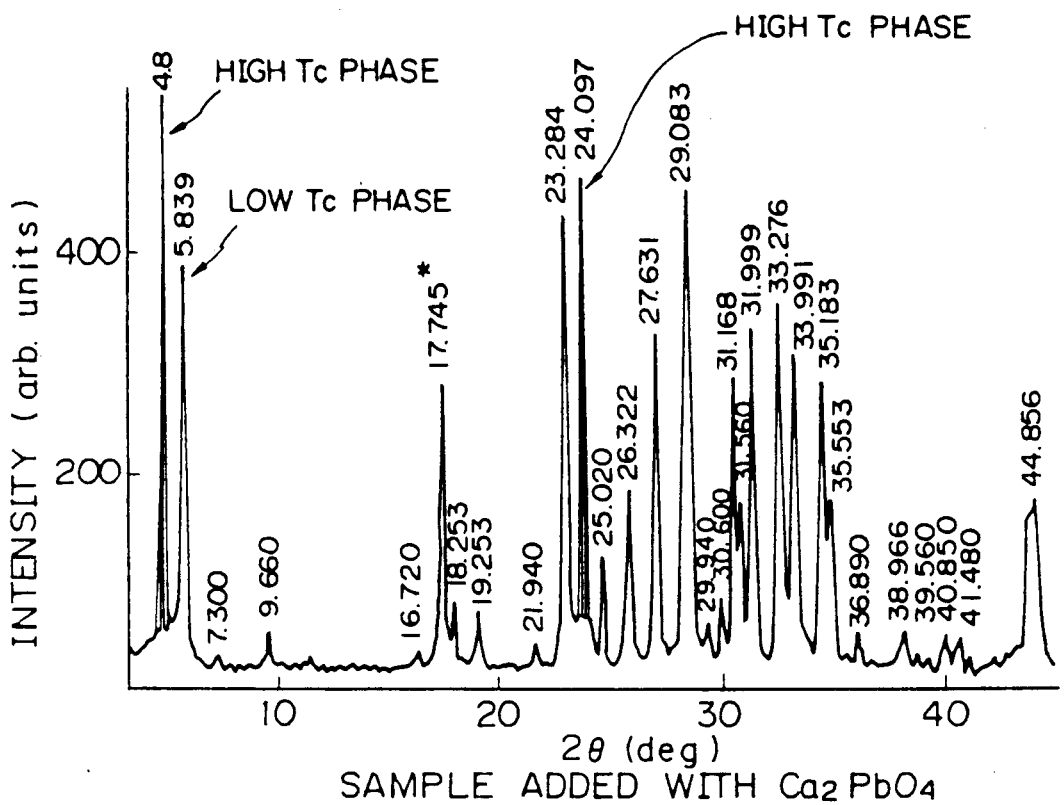
FIG. 8 shows an X-ray diffraction pattern of the sample to which $Ca_2PbO_x$ is added according to the present invention.

The resultant sample was examined by powder X-ray diffraction and the result thereof is shown in FIG. 8. It is shown in FIG. 8 that the peak ($2\theta=4.8°$) corresponding to the (0 0 2) plane of the high Tc phase is stronger than the peak ($2\theta=5.8°$) corresponding to the (0 0 2) plane of the low Tc phase.

Figure 9:
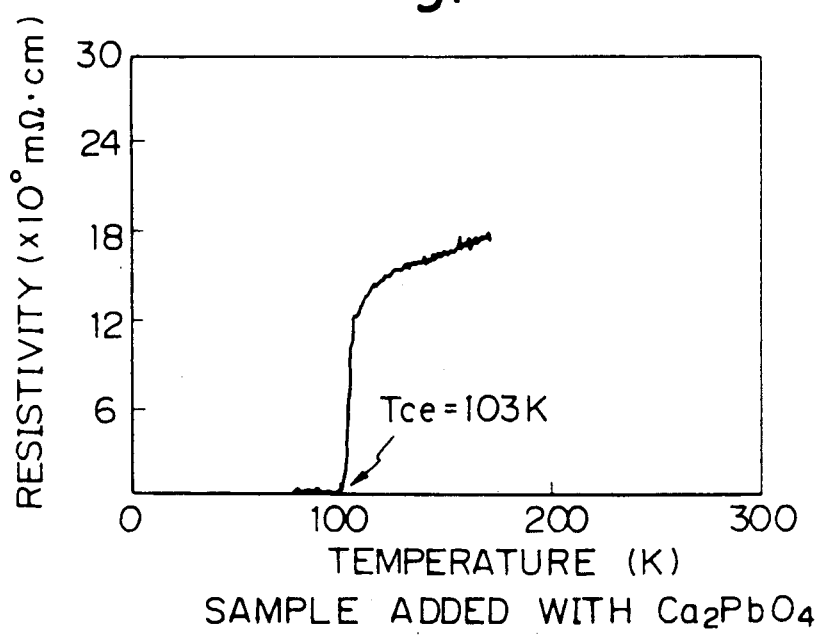
FIG. 9 shows the electric resistance depending on the temperature of the sample in FIG. 8.

FIG. 9 shows the electric resistance of the resultant sample in relation to the temperature. The $Tc_{end}$ was 103 K.

The results of the addition of PbO according to the prior art and the addition of $Ca_2PbO_4$ according to the present invention are compared in the following Table 1.

TABLE 1

| Additive | Firing time | High Tc phase/Low Tc phase |
| --- | --- | --- |
| PbO | 200 h | 0.7 |
| $Ca_2PbO_4$ | 30 h | 1.5 |

From Table 1, it can be seen that, as an additive for increasing the proportion of the high Tc phase in the Bi-Sr-Ca-Cu-0 system superconductor, $Ca_2PbO_4$ is superior to PbO.

EXAMPLE 3 (ADDITION OF $ca_2PbO_4$ TO Bi-Sr-Cu-O SYSTEM (NO Ca))

$Bi_2O_3$, $SrCO_3$ and CuO were weighed in a ratio of Bi:Sr:Cu =2:2:3, mixed, milled and then shaped under a pressure of 200 MPa, followed by firing in air at 840° C for 10 hours. The X-ray diffraction pattern demonstrated no peak at $2\theta=4.8°$ corresponding to the (0 0 2) plane of the high Tc phase, as in FIG. 6.

To this sample, the above $Ca_2PbO_4$ was added to provide a ratio of Bi:Sr:Ca:Cu =2:2:2:3 in the Bi-Sr-Ca-Cu-0 system, which was then fired in air at 840° C. for 40 hours. The X-ray diffraction pattern and change of electrical resistance depending on the temperature of the resultant sample were examined and are shown in FIGS. 10 and 11.

Figure 10:
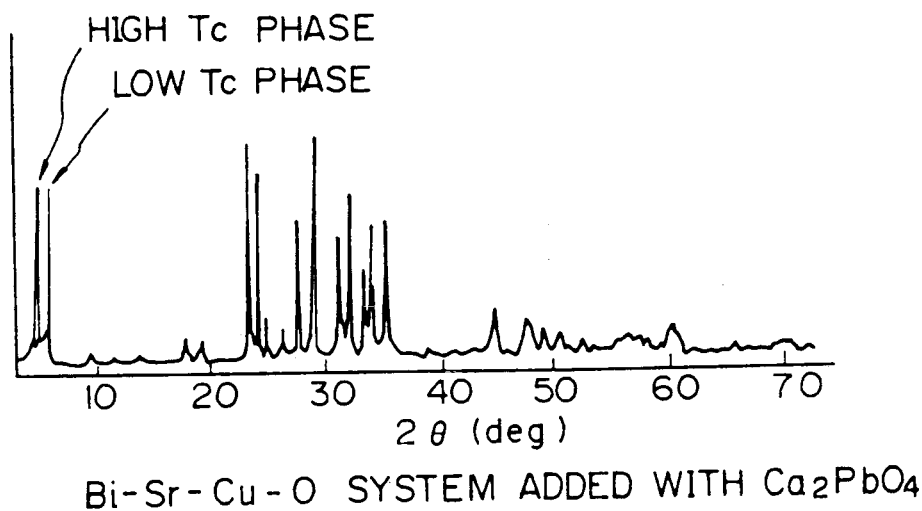
FIG. 10 shows the X-ray diffraction pattern of the sample in which $Ca_2PbO_x$ is added to the Bi-Sr-Cu-0 system.
Figure 11:
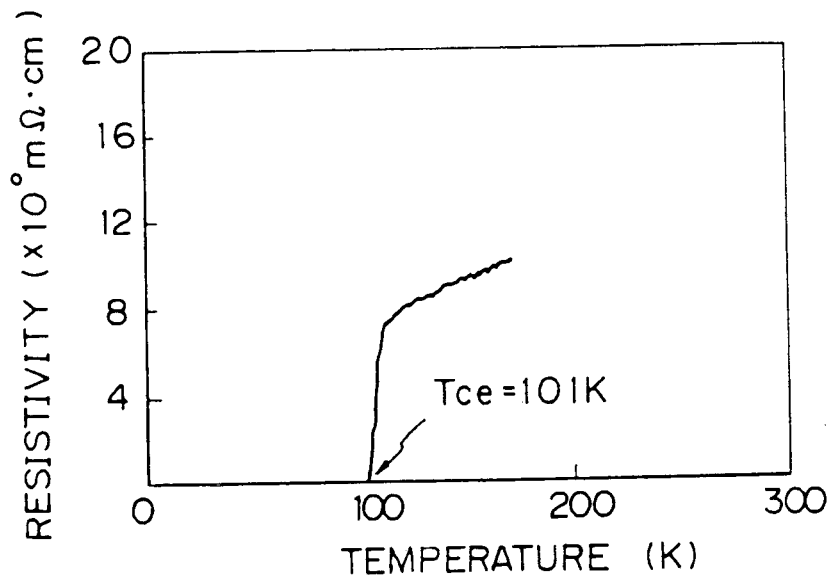
FIG. 11 shows the electric resistance depending on the temperature of the sample in FIG. 10.

It is clearly indicated from FIGS. 10 and 11 that a high Tc phase appeared due to the addition of $Ca_2PbO_4$. In the X-ray diffraction pattern of FIG. 10, the peak ($2\theta=4.8°$) corresponding to the high Tc phase is observed, and the electrical resistance depending on the temperature, as shown in the plot of FIG. 11, the $Tc_{end}$ was about 101 K.

EXAMPLE 4

The starting materials were $Bi_2O_3$, PbO, $SrCO_3$, CaO, and CuO. Powders were prepared by solid-state reaction with a nominal composition of Bi-Sr-Ca-Cu-0 =2:2:1.5:3.5, were mixed, milled, and then shaped under the pressure, and then fired in air at 820° C. for 6 hours, and 14.5% $Ca_2PbO_x$ powders which had been fired in air at 817° C. for 17 hours were added to these fired powders. The resultant mixture was mixed, milled, and then fired in air at 845° C. for 23 hours. The mass was mixed, milled, shaped under a pressure of 200 MPa to form pellets 15 mm in radius and about 2 mm thick, and then fired in air at 845° C. for 80 hours.

Figure 12:
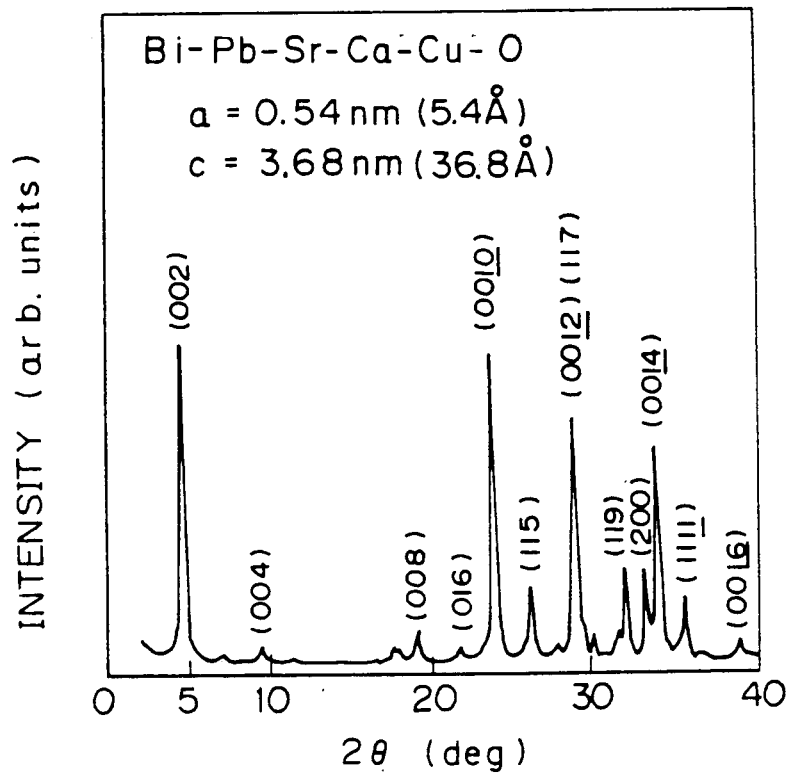
FIG. 12 shows an X-ray diffraction pattern of the sample in which $Ca_2PbO_x$ is added to the Bi-Sr-Ca-Cu-0 system.
Figure 13:
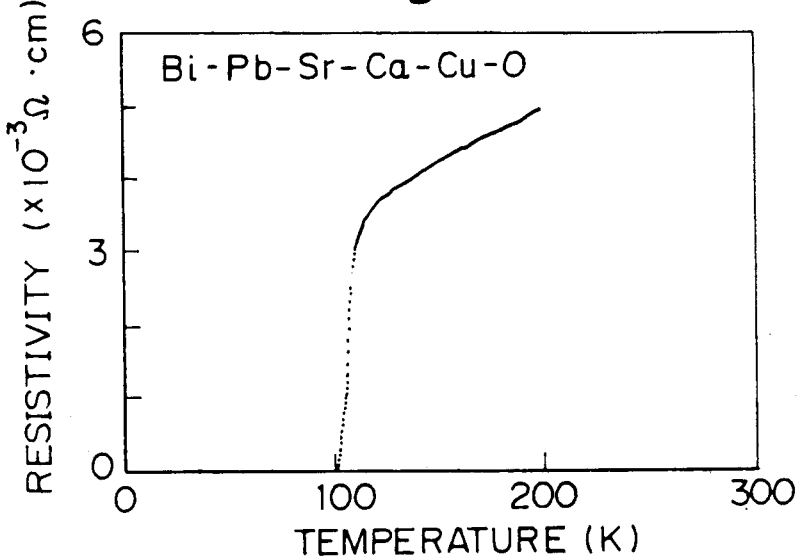
FIG. 13 shows the electric resistance depending on the temperature of the sample in FIG. 12.

FIG. 12 shows the powder X ray diffraction pattern of the resultant sample. The peak at $2\theta=4.8°$ corresponds to the (0 0 2) plane of The peak at $2\theta=5.7°$ corresponding to the (0 0 2) plane of the low Tc phase was not seen, although small amounts of the peaks at $2\theta=7.2°$ and 11.7° corresponding to Bi-Sr-Cu-0 system and $Ca_2PbO_x$, existed. All peaks were indexed on the assumption that the unit cell was tetragonal. The a-axis is 0.54 nm (5.4 AÅ) and the c-axis is 3.7 nm (37 AÅ). FIG. 13 shows the electrical resistivity dependence on the temperature of the sample. A drop of the resistivity is seen at 110 K, and the $Tc_{end}$ is 100 K.

Figure 14A:
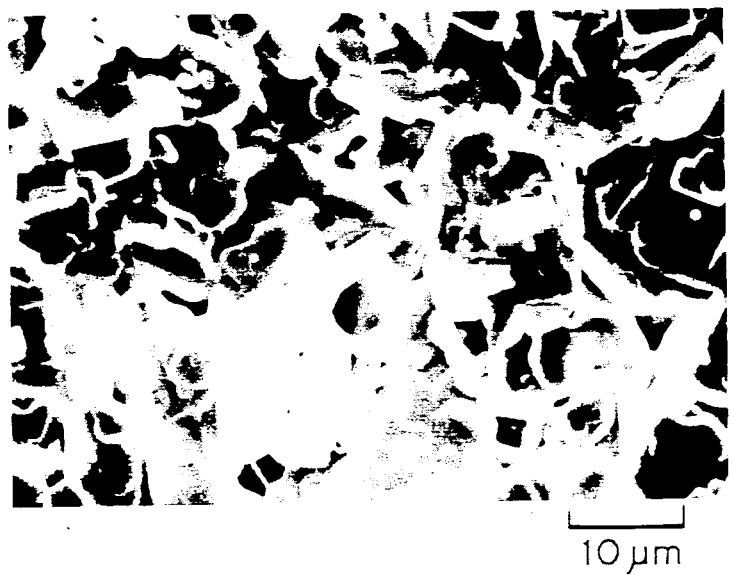
FIG. 14A and 14B show SEM images of a surface and fractured cross section of the sample in Example 4.
Figure 14B:
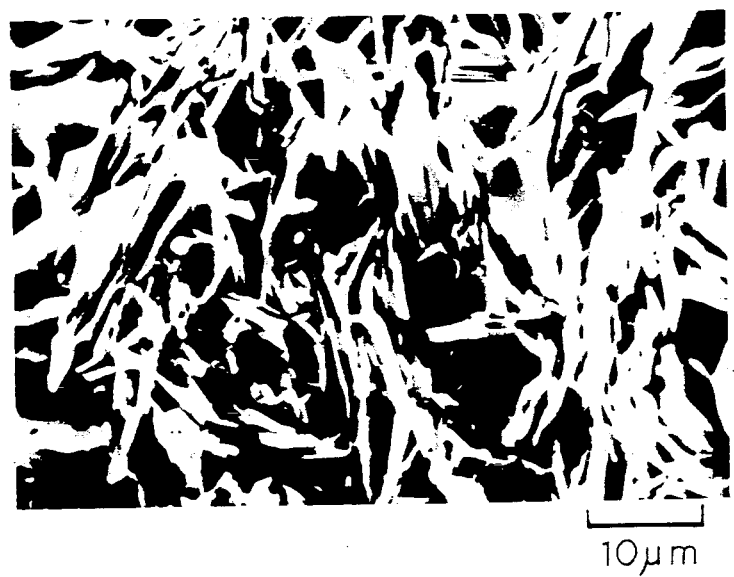

SEM images of the surface and the fractured cross section are shown in FIGS. 14A and 14B. The view of the cross section suggests that the high-Tc phase consists of a stacked plane. From the X-ray diffraction pattern of the surface, the c-axis orientation observed was stronger than for the pattern of the powder, and it appeared that the high-Tc phases grow faster along the a-b plane and that the c-axis crystal orientation results from the synthesis process which presses the powders contained in the high-Tc phase. The surface of the sample was observed by electron probe microanalyzer (EPMA), and the cationic ratio was approximately Bi:Pb:Sr:Ca:Cu =1.9:0.3:1.6:1.9:3.4. These values are almost equal to the results of the inductively coupled plasma ICP analysis.

FIG. 15 shows the magnetization curve measured at 77.3 K. The magnetization was proportional to the magnetic field below 10 Oe, which is the lower critical field, $H_{c1}$. The magnetization value corresponding to 6.5 Oe belo $H_{c1}$ is $-0.129$ emu/g. The density of the sintered bulk was 3.8 g/cm$^3$. The demagnetizing factor n is 0.54, assuming that the disk-shaped sample can be approximated to ellipsoids of nearly the same size. The volume fraction of the superconducting phase above 77.3 K is 74% from the value of $-4\pi M/H$. The low-Tc phase does not exist from the powder X-ray diffraction pattern. This suggests that the volume fraction of the high-Tc phase is 74%.

Figure 16:
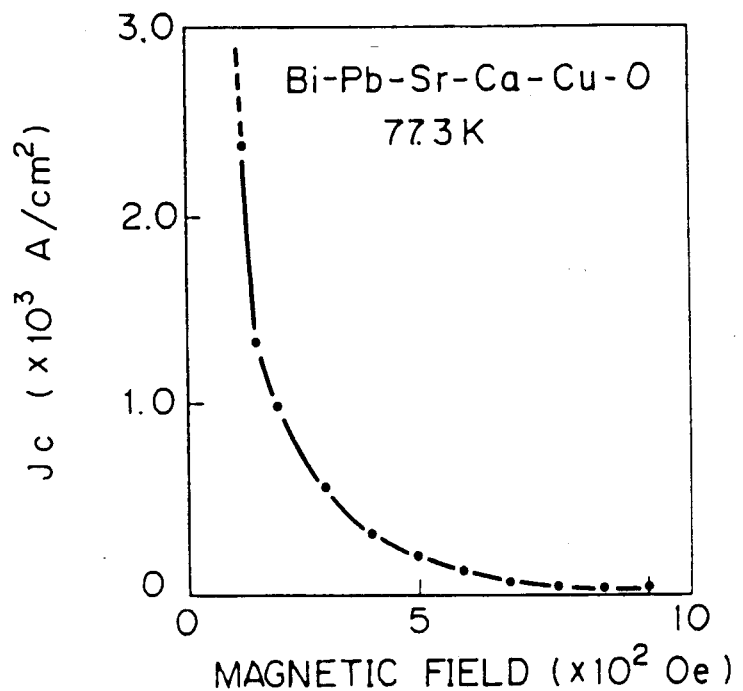
FIG. 16 shows Jc estimated versus applied magnetic filed in Example 4.

The critical current density, Jc, can be estimated from the hysteresis of magnetization assuming a critical state model. A simple formula is as follows (Phys. Rev. Lett. 8 (1962) 250).

$$Jc(A/cm^2) = 30\Delta M/d \quad (1)$$

where M (emu/cm$^3$) is the hysteresis of magnetization and d is the thickness of the sample slab. The Jc estimated using equation (1) versus the applied magnetic field, is shown in FIG. 16. The Jc is estimated to be $2.3 \times 10^3$ A/cm$^2$ in an applied magnetic field of $1.25 \times 10^2$ Oe. The decreasing ratio of Jc in the magnetic field is larger than the corresponding ratio of the Y-Ba-Cu-0 system.

The Jc at 77.3 K measured by the resistive method was 47 A/cm$^2$, and was obtained from the V-I characteristic curves using a 10 $\mu$V/cm criterion. It appears that the difference in Jc between the resistive and magnetization methods results from the grain boundaries and low density of the sintered bulk.

Figure 17:
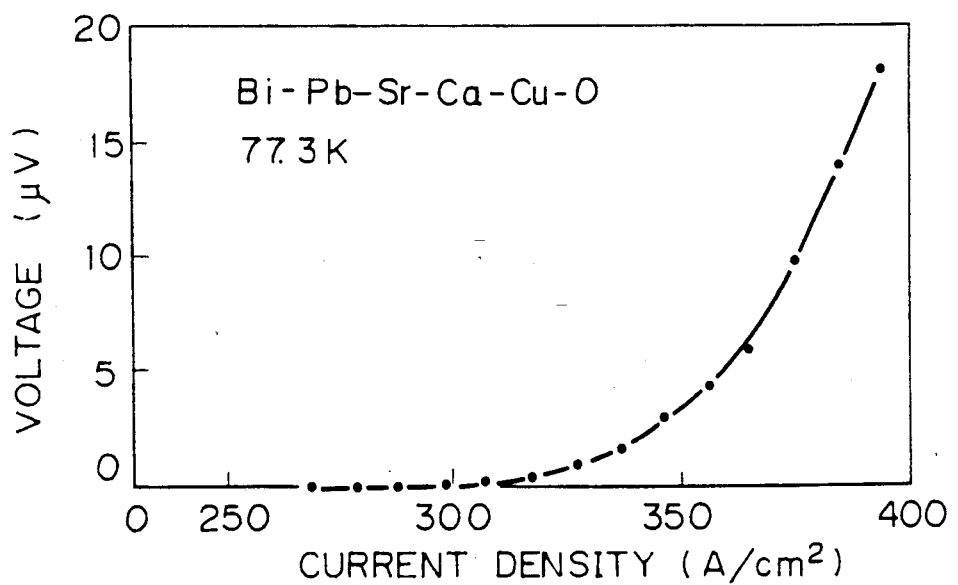
FIG. 17 shows Jc of the another sample in Example 4.
Figure 18:
FIG. 18 shows and SEM of a fractured cross section of the another sample in Example 4.

Another sample was fabricated by firing at 845° C. for 50 hours after the sample was repressed. The density of this sample increased from 3.8 to 4.5 g/cm$^3$. The Jc was measured by the resistive method and increased to $3.0 \times 10^2$ A/cm$^2$, as shown in FIG. 17. FIG. 18 shows the microstructure of a fractured cross section of the sample, and a high c-axis orientation can be observed. The Tce of this sample is 100 K, the same as the Tce before the sample was repressed. Endo et al (Jpn. J. Appl. Phys. 27 (1988) L1476) reported that the Tce of the Bi-Pb-Sr-Ca-Cu-0 system is 107.5 K. It appears that impurities existing in the grain boundaries influence the Tce, because the Tce is unchanged despite an increased Jc.

EXAMPLE 5 (INFLUENCE OF ADDITION OF $ca_2PbO_x$ t TO Bi-Pb-Sr-Ca-Cu-O SYSTEM)

Samples were prepared with a composition of cationic ratio Bi:Pb:Sr:Ca:Cu =0.7:0.3:1:1:1.8 and 2:x:2:2:3 (x =0, 0.5, and 1.0) by solid reaction. The starting materials were $Bi_2O_3$, PbO, $SrCO_3$, CaO and CuO, which were mixed and milled in a ball mill for 24 hours, and then shaped under a pressure of 200 MPa to form pellets 5 mm in diameter and about 3 mm in thickness. The conditions of the preparation were as shown in Table 2.

TABLE 2

| Sample No. | Bi | Pb | Sr | Ca | Cu | (°C.) Tmp. | hour | atmos. |
|---|---|---|---|---|---|---|---|---|
| 1A* | 0.7 | 0.3 | 1.0 | 1.0 | 1.8 | 841 | 10 | air |
| 1B* | 0.7 | 0.3 | 1.0 | 1.0 | 1.8 | 841 | 50 | air |
| 1C* | 0.7 | 0.3 | 1.0 | 1.0 | 1.8 | 841 | 200 | air |
| 2A | 2.0 | 0.0 | 2.0 | 2.0 | 3.0 | 841 | 15 | air |
| 2B | 2.0 | 0.5 | 2.0 | 2.0 | 3.0 | 841 | 15 | air |
| 2C | 2.0 | 1.0 | 2.0 | 2.0 | 3.0 | 841 | 15 | air |
| 2D | 2.0 | 0.5 | 2.0 | 2.0 | 3.0 | 750 | 9 | air (quench to r.t.) |
| 3A | 2.0 | 0.0 | 2.0 | 0.0 | 3.0 | 841 | 24 | air |
| 3B | 0.0 | 1.0 | 0.0 | 2.0 | 0.0 | 817 | 17 | air |
| 3C | Sample 3A + Sample 3B (30 wt %) | | | | | 848 | 74 | air |

Note:
*indicates prior art.

The sample 3C was obtained by preparing the Bi-Sr-Cu-O system with Bi:Sr:Cu=2:2:3, fired at 840° C. for 6 hours; adding and mixing 30 wt % of $Ca_2PbO_x$; firing at 848° C. for 24 hours; shaping under a pressure of 200 MPa; and firing at 848° C. for 50 hours.

Electrical resistance measurement, X-ray diffraction; and Raman spectroscopy of the sample were carried out.

Figure 19:
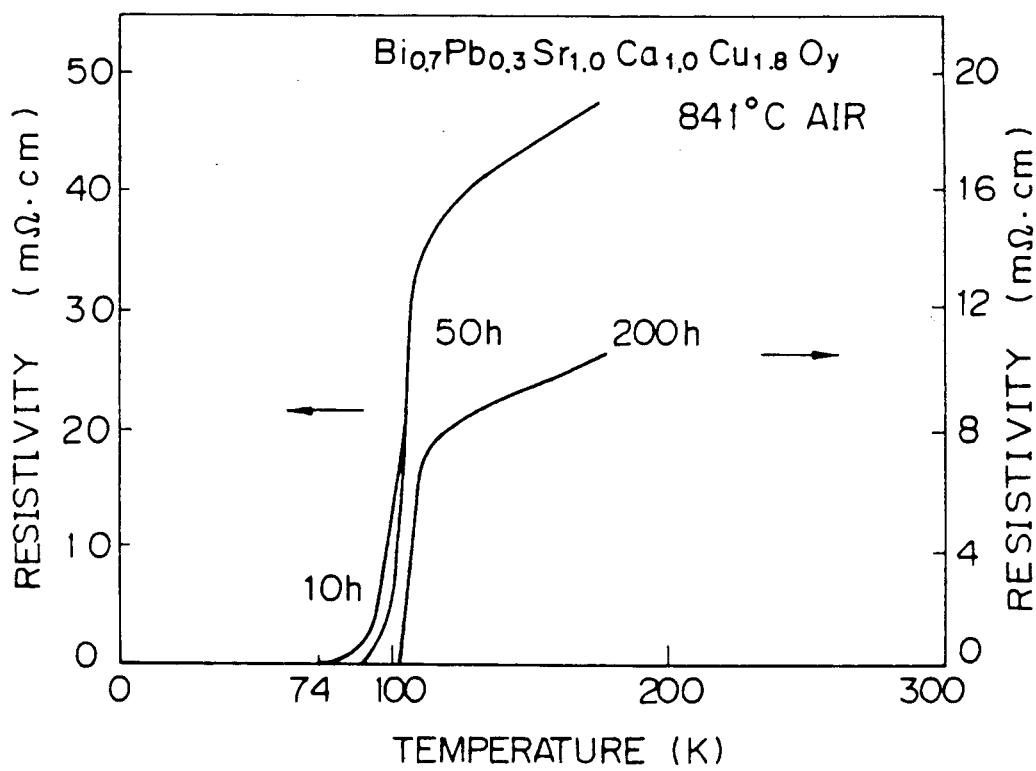
FIG. 19 shows the electric resistances depending on temperatures of the samples prepared by firing a composition of Bi:Pb:Sr:Ca:Cu = 0.7:0.3:1:1:1.8 at 841° C for 10h, 50h, and 200h.

FIG. 19 shows the temperature dependence of the electric resistance of samples 1A to 1C. For sample 1A, the resistivity drop was observed at 110K, but the $Tc_{end}$ was 74 K. Although the on-set temperature of the sample 1B was the same as that of the sample 1A, the $Tc_{end}$ was increased from 74 K to 85 K. Further, when the firing time was longer than for the samples 1A and 1B, the electric resistance at 170 K was decreased to about 1/5, and the $Tc_{end}$ was increased to 103 K.

Figure 20:
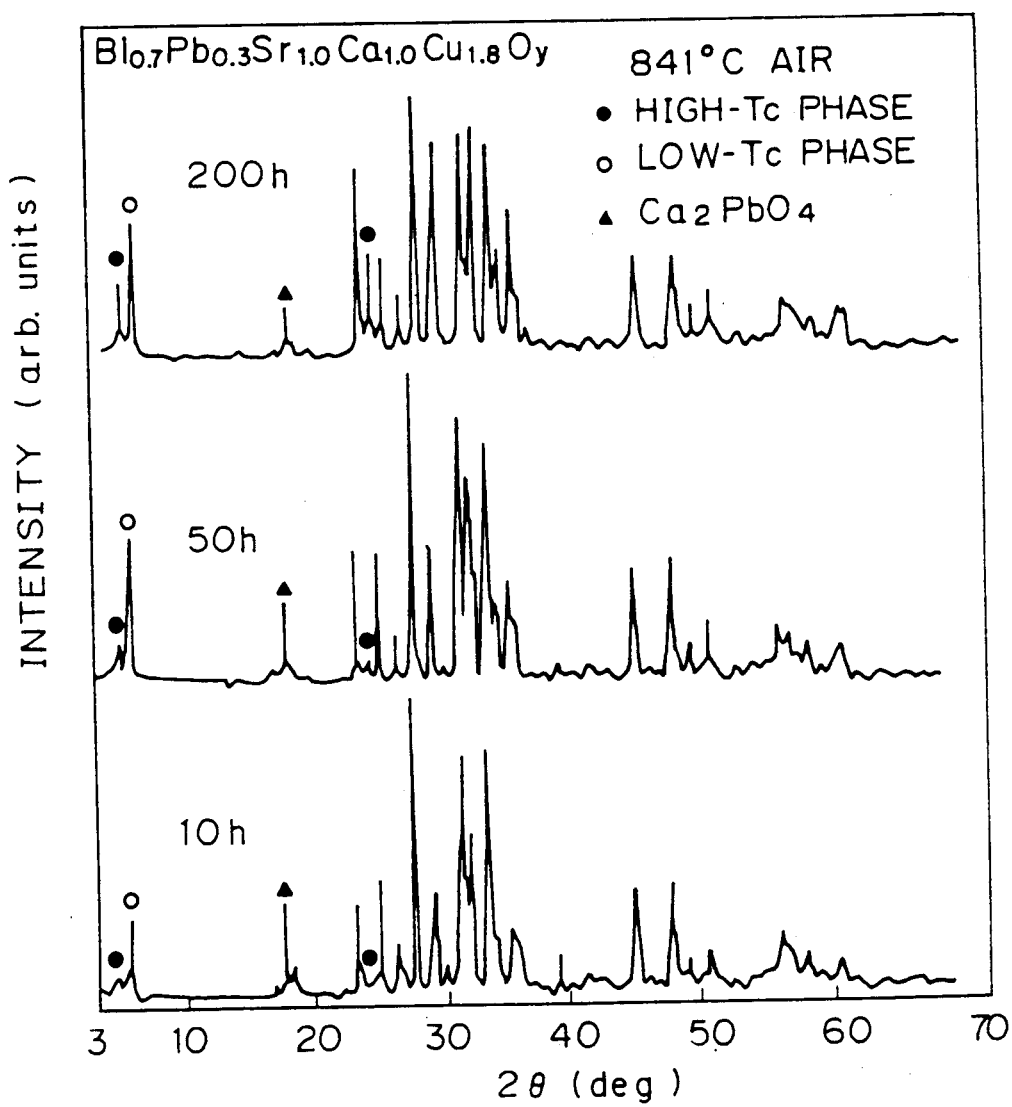
FIG. 20 shows X-ray diffraction patterns of the samples in FIG. 14.

FIG. 20 shows the X-ray diffraction patterns of the samples 1A, 1B, 1C. With an increase of the firing time, the peak at $2\theta=4.8°$ was strengthened, which peak corresponds to the (0 0 2) plane of the high Tc phase amd the c-axis is 37 AÅ. the X-ray diffraction patterns indicate an increase of the high Tc phase with the increase of the firing time.

Figure 21:
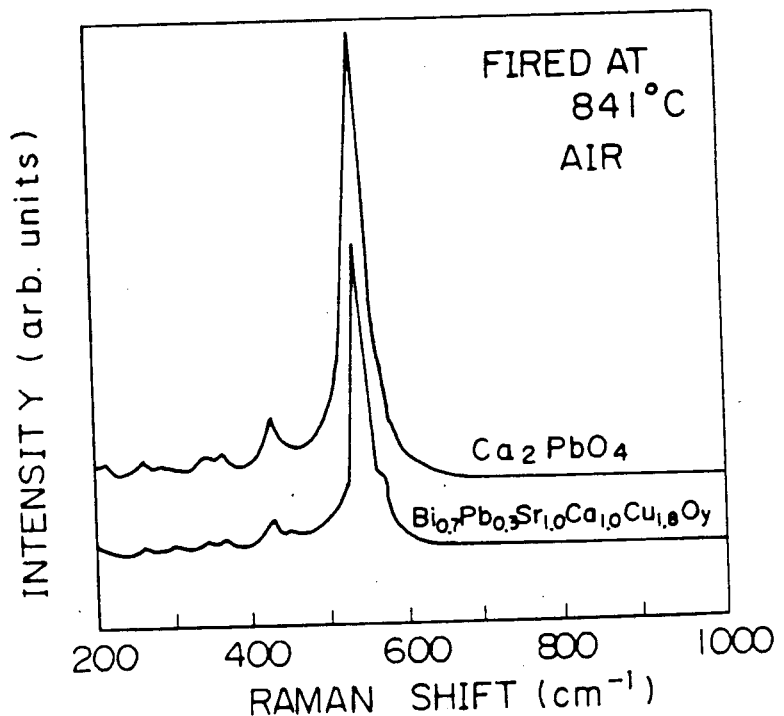
FIG. 21 shows Raman spectrums of pellets of fired $C_2Pbo_x$ and the Bi-Sr-Ca-Cu-0 system.

In the sample 1A, an unidentified material having a diameter of about 10 μm was observed, which was identified by micro-Raman scattering. The result thereof is shown in FIG. 21, by a comparison with the Raman spectrum of the Sample 3B. The X-ray diffraction of the sample 3B indicates that the sample 3B was the single phase of $Ca_2PbO_x$ as shown in FIG. 7 (Z. anorg. allgem. chem. 371, 1969, 237). In both of the unidentified materials of the sample 1A and the sample 3B, six Raman spectrums were observed between 200 and 1000 cm$^{-1}$ (255, 340, 354, 422, 540, 562 cm$^{-1}$). From this, it is clear that the addition of PbO to the Bi-Sr-Ca-Cu-O was the reason for the formation of $Ca_2PbO_x$.

The main peak of the X-ray diffraction pattern of $Ca_2PbO_x$ exists at 17.7° as shown in FIG. 7, and was observed in the X-ray diffraction pattern of the Bi-Pb-Sr-Ca-Cu-O system (FIG. 15). This peak was weakened with an increase of the firing time. An observation of the surface of the Bi-Pb-Sr-Ca-Cu-O system by microscopy also indicates that $Ca_2PbO_x$ was decreased in line with or increased with the firing time.

Figure 22:
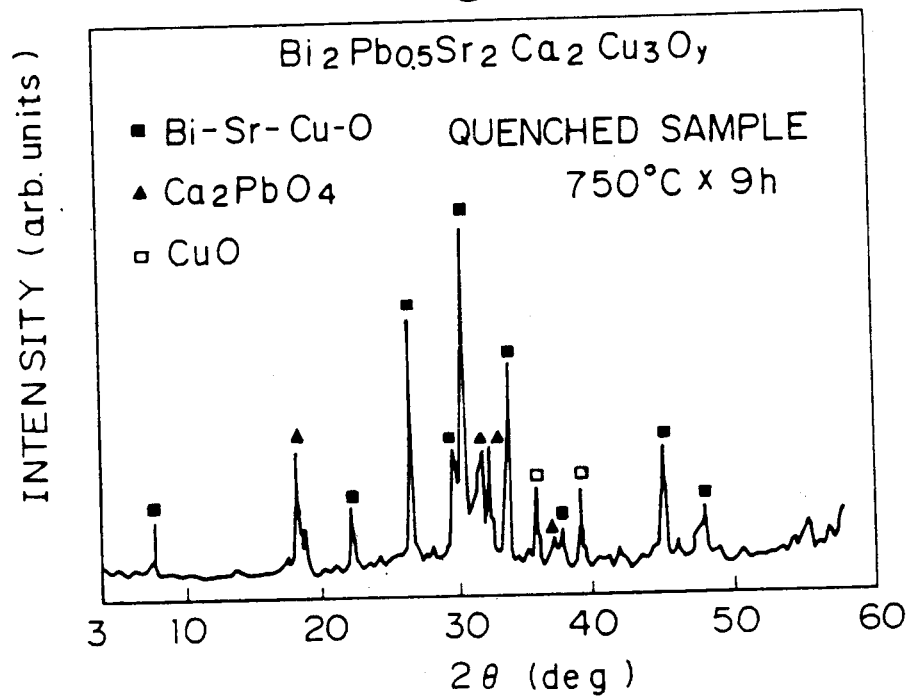
FIG. 22 shows X-ray diffraction patterns of the samples prepared by firing a composition of Bi:Pb:Sr:Ca:Cu =2:x:2:2:3 (x =0, 0.5, and 1.0) at 41° C for 15h.

FIG. 22 shows the X-ray diffraction patterns of the samples 2A, 2B and 2C. When x =0, i.e., the sample 2A, weak peaks at $2\theta=5.7°$ and $2\theta=7.3°$ were observed but the peak at $2\theta=4.8°$ was not observed. Namely, the high Tc phase was not synthesized from the stoichiometric composition of Bi:Sr:Ca:Cu =2:2:2:3 under the conditions as shown in Table 2 (sample 2A). Note, the peak at $2\theta=7.3°$ corresponds to the (0 0 2) plane of the Bi-Sr-Cu-O system with the c-axis, 24 AÅ. When x is 0.5 (sample 2B), a peak at $2\theta=4.8°$ was observed which corresponds to the (0 0 2) plane of the high Tc phase. When x is 1.0 (sample 2C), the high Tc phase was not observed and the low Tc phase and Bi-Sr-Cu-O system were observed. The peak of $Ca_2PbO_x$ was strengthened with an increase of PbO. The high Tc phase was synthesized at a composition of Bi:Pb:Sr:Ca:Cu =2:x:2:2:3 and the appropriate PbO addition amount was x =0.5.

Figure 23:
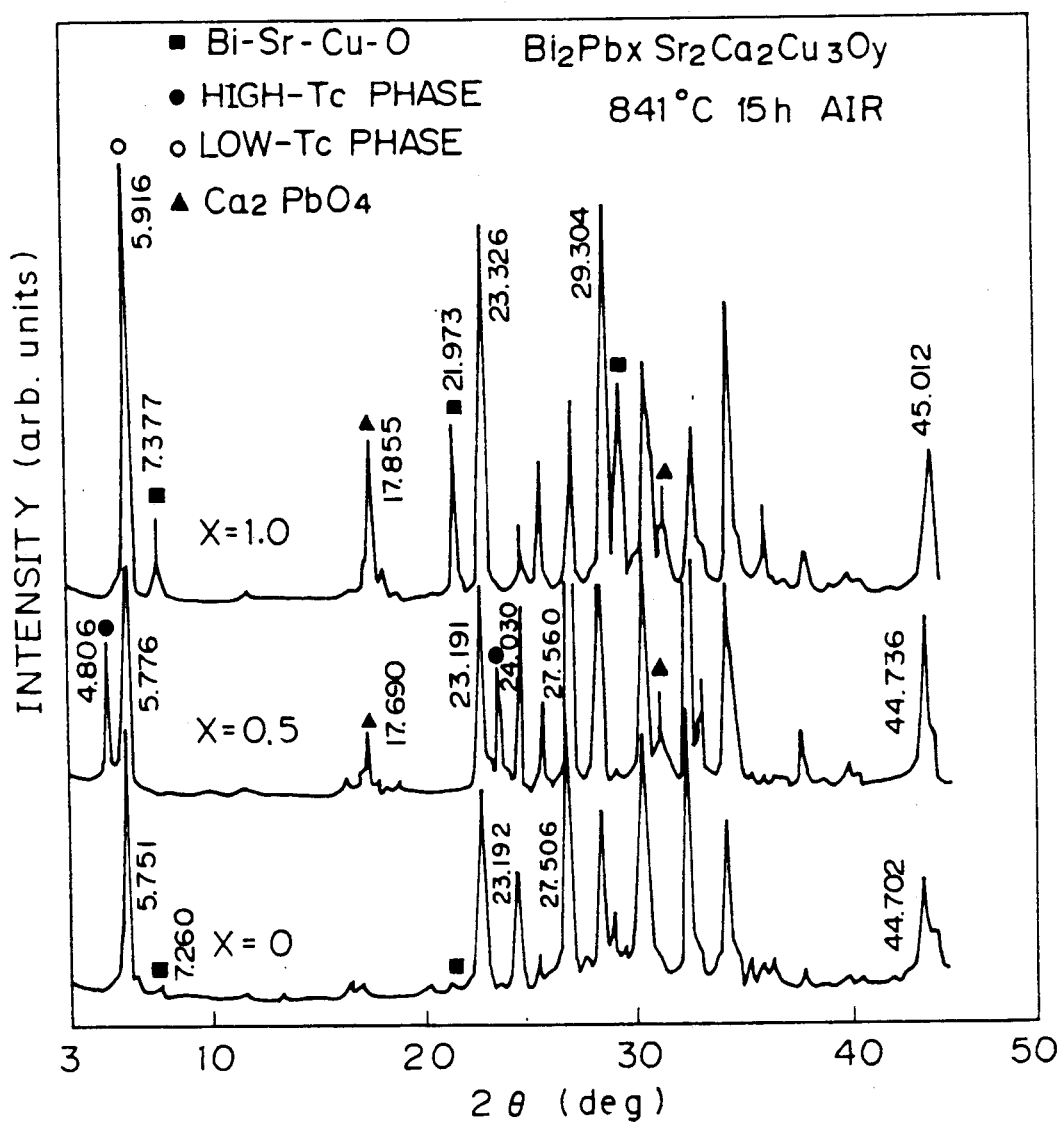
FIG. 23 shows the X-ray diffraction pattern of the sample prepared by firing a composition of Bi:Pb:Sr:Ca:Cu =2:0.5:2:2:3 at 750° C for 9h and then quenching to room temperature.

FIG. 23 shows the X-ray diffraction of the sample 2D, fired at 750° C for 9 hours and then quenched to room temperature. Only the peak at $2\theta=7.3°$ corresponding to the (0 0 2) plane of the Bi-Sr-Cu-O system, was observed. At 750° C., $Ca_2PbO_x$ and Bi-Sr-Cu-O system were synthesized and another phase of unreacted CuO was found.

Figure 24:
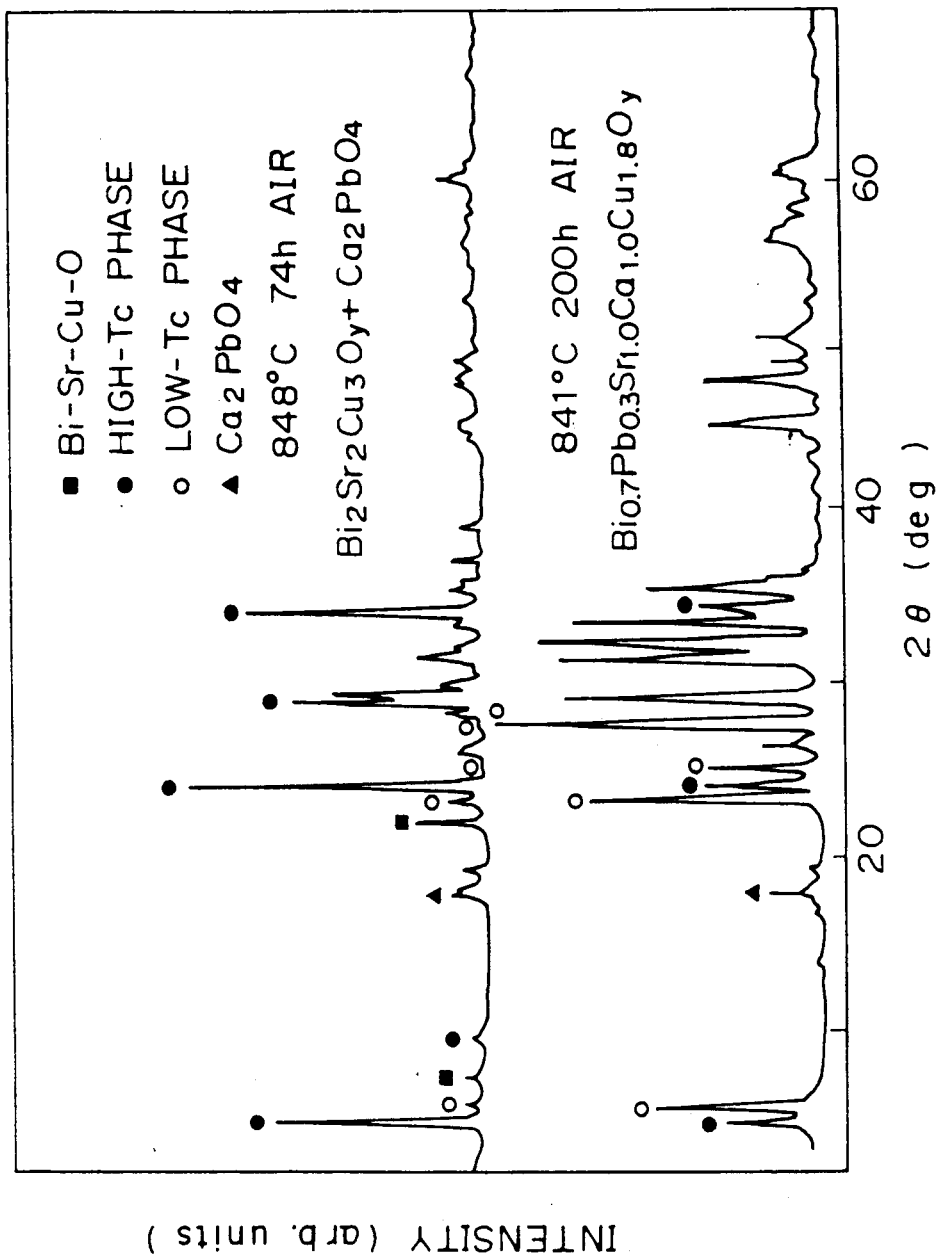
FIG. 24 shows X-ray diffraction patterns of the sample 1C with a composition of Bi:Pb:Sr:Ca:Cu =0.7:0.3:1:1:1.8 and the sample in which 30 wt% of $Ca_2Pbo_x$ is added to the Bi-Sr-Cu-0 system.

The main phase of the sample 3A was the Bi-Sr-Cu-O system. FIG. 24 shows the X-ray diffraction pattern of the sample 3C in which $Ca_2PbO_x$ was added to the sample 3A. It is seen that the high Tc phase (100 K grade) was formed and the proportion of the high Tc phase to the low Tc phase (80 K grade) was about 10 times higher than that of the sample 1C in the prior art. The X-ray diffraction of the sample 2D indicates that, at 750° C., the high Tc phase (100 K grade) and low Tc phase (80 K grade) were not formed but $Ca_2PbO_x$ and the Bi-Sr-Cu-O system compound (10 K grade) were formed. After being fired at 841° C for 15 hours, the Bi-Sr-Cu-O system compound disappeared and the high and low phases were formed. The phase diagram (U. Kuxmann et al., Erzmetall, 27, 1974, 533) shown in FIG. 2 indicates that $Ca_2PbO_x$ is decomposed to become CaO and a liquid phase above 822° C. It is considered that these two phases act as an accelerator when forming the high Tc phase. It is assumed that the presence of CaO and the liquid phase accelerates a reaction between the two CuO layers of Bi-Sr-Ca-Cu-O system compound and the decomposed CaO moving in the liquid phase.

Ca and Pb must be bound in a ratio of Ca:Pb =2:1, as $Ca_2PbO_x$. The reason why the sample 2B (x =0.5) forms the high Tc phase but the sample 2C (x =1.0) does not form the high Tc phase is that a reaction between CaO and PbO occurs at a ratio of Ca:Pb =2:1. The Bi-Sr-Cu-O system compound and $Ca_2PbO_x$ are formed at 750° C. or less. The low Tc phase having two CuO layers (80 K grade) can be formed at 800° C. or higher. In the sample 2B, $Ca_2PbO_x$ (0.5 mole) is formed at 750° C. and the low Tc phase is formed at 822° C. or lower using the remaining Ca ions. At 822° C., $Ca_2PbO_x$ is decomposed into CaO and the liquid phase. The high Tc phase is considered to be formed by reaction between the low Tc phase and CaO. When x is 1.0 (sample 2C), the low Tc phase is not formed at 800° C. because of an insufficiency of Ca ions ($Ca_2PbO_x$ first supplies CaO at 822° C. to the Bi-Sr-Cu-O system).

The role of Pb in the Bi-Pb-Sr-Ca-Cu-O system was examined. $Ca_2PbO_x$ was formed at 750° C. or lower and the high Tc phase was formed by adding $Ca_2PbO_x$ to the Bi-Sr-Cu-O system compound having a single CuO layer. The high Tc phase is considered to be formed by the reaction, in the liquid phase formed at 822° C., between the low Tc phase and Ca ions.

As other additives, CaAl$_2$O$_4$, CaSiO$_4$, CaSO$_4$ etc. can be considered but do not form the high Tc phase, since a liquid phase is not formed during firing of the Bi-system superconductor due to a high melting point thereof.

EXAMPLE 6 (bi$_2$Pb$_1$Sr$_2$Ca$_3$Cu$_4$O$_b$)

Similar procedures were carried out as in the above Examples except that the starting materials were weighed to form Bi$_2$Pb$_1$Sr$_2$Ca$_3$Cu$_4$O$_b$, mixed, milled and then shaped under a pressure of 200 MPa and then fired at 840° C. in air for 72 hours.

Figure 25:
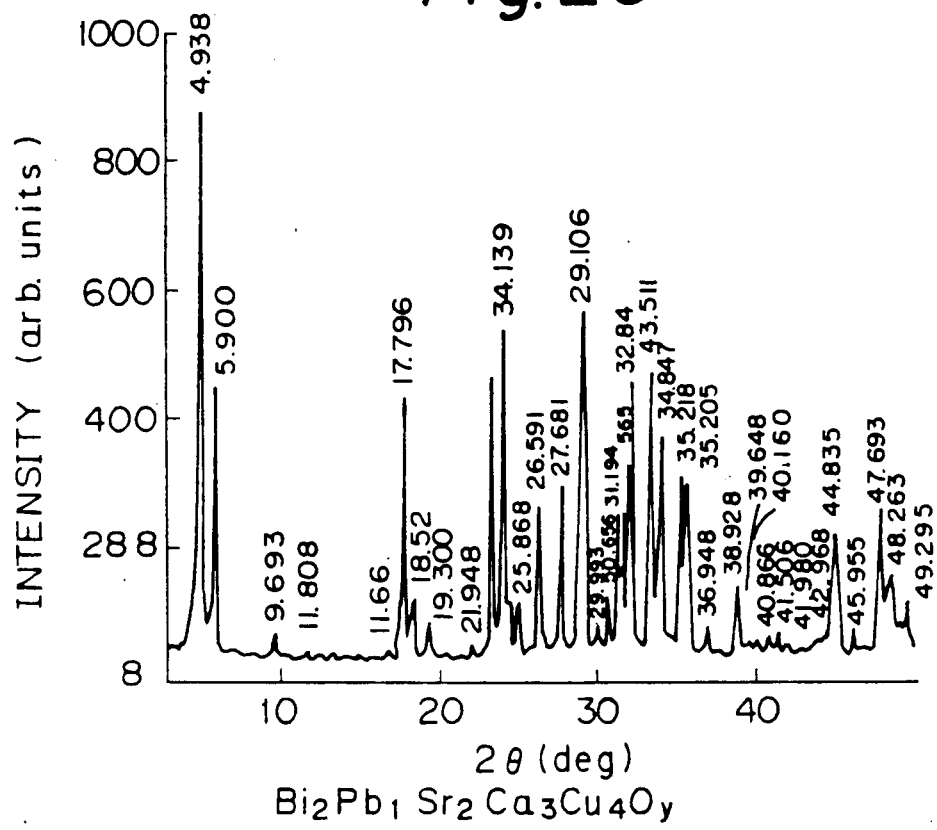
FIG. 25 shows an X-ray diffraction pattern of the sample with a composition of $Bi_2Pb_1Sr_2Ca_3Cu_4O_y$.

The X-ray diffraction pattern of the resultant sample is shown in FIG. 25. It is seen that the peak of the high Tc phase is stronger than the peak of the low Tc phase.

Figure 26:
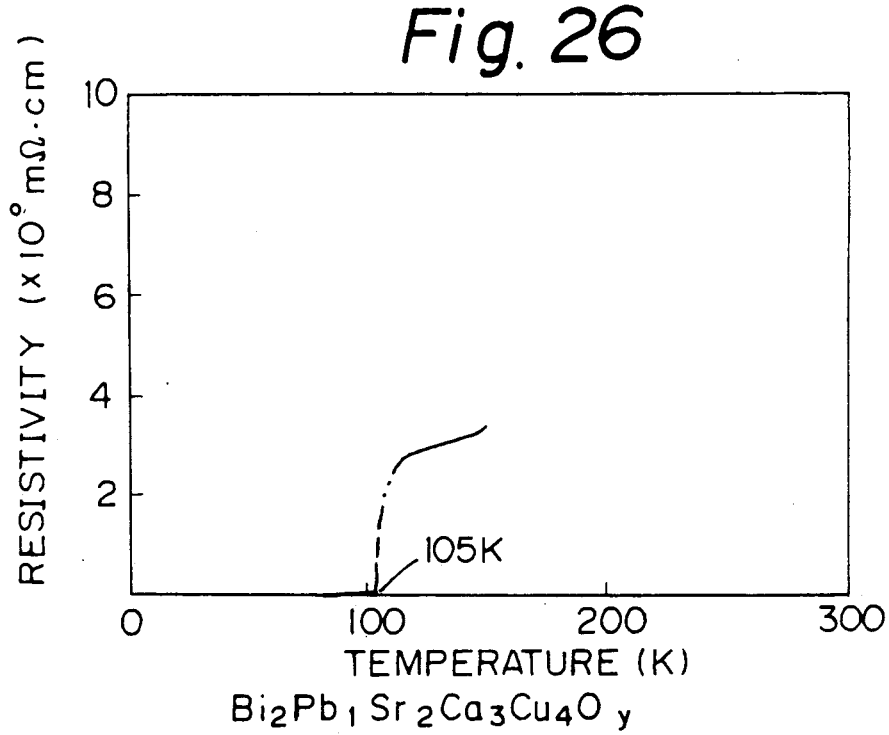
FIG. 26 shows the electric resistance depending on the temperature of the sample in FIG. 20.

FIG. 26 shows the electric resistance dependence on the temperature of the sample. The Tc$_{end}$ was 103 K.

EXAMPLE 7 (Bi$_2$Pb$_{1.5}$Sr$_2$Ca$_4$Cu$_5$O$_b$)

Similar procedures were carried out as in the above Examples, except that the starting materials were weighed to form Bi$_2$Pb$_{1.5}$Sr$_2$ca$_4$Cu$_5$O$_b$, mixed, milled and shaped under a pressure of 200 MPa and then fired at 840° C. in air for 72 hours.

Figure 27:
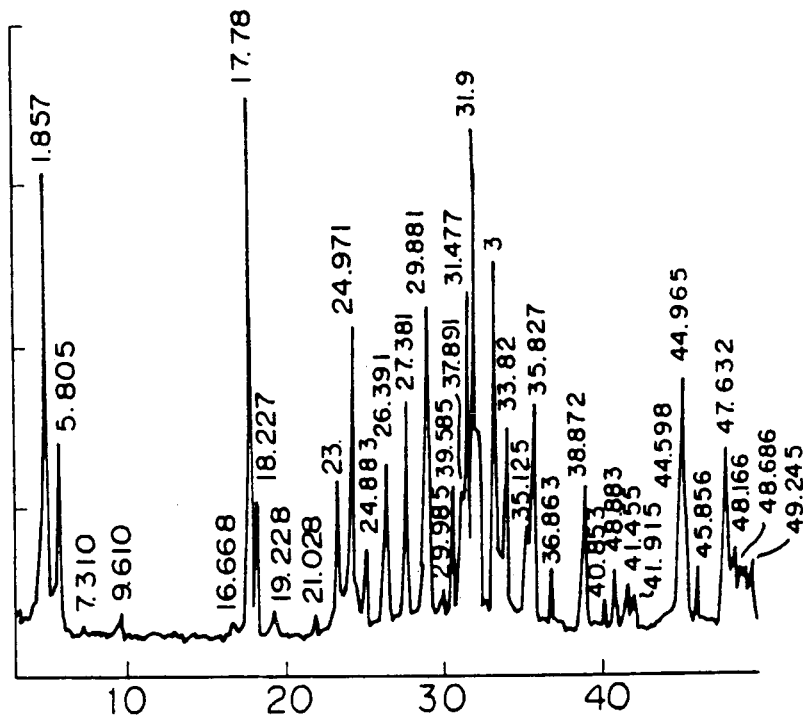
FIG. 27 shows an X-ray diffraction pattern of the sample with a composition of $Bi_2Pb_{1.5}Sr_2Ca_4Cu_5O_y$; and, FIG. 28 shows the electric resistance depending on the temperature of the sample in FIG. 22.
Figure 28:
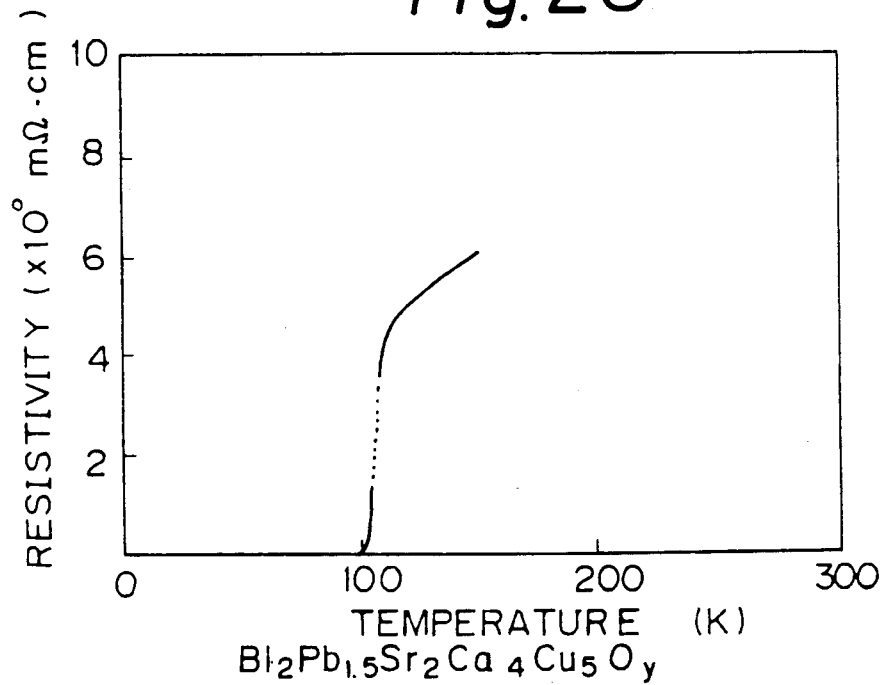

The X-ray diffraction pattern of the resultant sample is shown in FIG. 27. It is seen that the peak of the high Tc phase is stronger than the peak of the low Tc phase.

FIG. 23 shows the electrical resistance dependence on the temperature of the sample. The Tc$_{end}$ was 103 K.

In Examples 5 to 7, the compositions that form the high Tc phase can be represented by the formula:

$$Bi_2Pb_{(n-1)/2}Sr_2Ca_nCu_{n+1}O_b$$

where a = 3 (Example = 3 (Example 6) and a = 4 (Example 7).

The Bi(-Pb)-Sr-Ca-Cu-O system and Tl(-Pb)-Ba-Ca-Cu-O system superconductors can be considered and treated equally, and therefore, it will be obvious that the same considerations as for the Bi(-Pb)-Sr-Ca-Cu-O system may be applied to the Tl(-Pb)-Ba-Ca-Cu-O system, to persons skilled in the art.

We claim:

1. A process for preparing a superconductor, comprising the steps of:
    preparing a first material, in the form of powder mixture or sintered mass, having a composition represented by the formula (I):

$$Bi_{u'}Pb_{v'}Sr_{w'}Ca_{x'}Cu_{y'}O_z \quad (I)$$

where $1 \leq u' 3, 0 \leq v' \leq 1, 1 \leq w' \leq 3, 0 \leq x' \leq 12, 1 \leq y' \leq 12, 3 \leq z' \leq 39.5$;

adding to the first material a calcium compound, selected from the group consisting of Ca$_2$PbO$_4$ and Ca$_2$PbO$_3$, and which forms a mixed phase involving CaO and a liquid phase at a temperature not higher than 900° C.; and firing the resulting mixture of the first material and the calcium compound at a temperature not higher than 900° C. to obtain a superconductor represented by the formula (II):

$$Bi_uPb_vSr_wCa_xCu_yO_z \quad (II)$$

where $1 \leq u \leq 3, 0 \leq v \leq 1, 1 \leq w \leq 2, 2 \leq x \leq 10, 3 \leq y \leq 11, 6 \leq z \leq 35$.

2. A process according to claim 1, wherein in the formula (II), y = x + 1.

3. A process according to claim 1, wherein in the formula (I), $1.5 \leq u' \leq 2.5$, $O \leq v' \leq 1, 1.5 \leq w' \leq 2.5, 0 \leq x' \leq 4, 3 \leq y' \leq 8, 3 \leq z' \leq 25$.

4. A process according to claim 3, wherein the formula (I), $1.5 \leq u' \leq 2.5, 0 \leq v' \leq 0.5, 1.5 \leq w' \leq 2.5, 1.0 \leq x' \leq 2.0, 3.0 \leq y' \leq 4.0, 5.0 \leq z' \leq 17.0$.

5. A process according to claim 1, wherein said calcium compound is added in an amount of 10 to 50 % by weight.

6. A process according to claim 5, wherein said calcium compound is added in an amount of 10 to 20 % by weight.

7. A process according to claim 1, wherein said firing is carried out at a temperature of 750° C. to 880° C.

8. A process according to claim 7, wherein said firing is carried out at a temperature of 840° C. to 850° C.

9. A process for preparing a superconductor, comprising the steps of:
    preparing a first material, in the form of powder mixture or sintered mass, having a composition represented by the formula (III):

$$Tl_{u'}Pb_{v'}Ba_{w'}Ca_{x'}Cu_{y'}O_{z'} \quad (III)$$

where $1 \leq u' \leq 3, 0 \leq v' \leq 1, 1 \leq w' \leq 3, 0 \leq x' \leq 12, 1 \leq y' \leq 12, 3 \leq z' \leq 39.5$;

adding to the first material a calcium compound, selected from the group consisting of Ca$_2$PbO$_4$ and ca$_2$PbO$_3$, and which forms a mixed phase involving caO and a liquid phase at a temperature not higher than 900° C.; and firing the resulting mixture of the first material and the calcium compound at a temperature not higher than 900° C. to obtain a superconductor represented by the formula (IV):

$$Tl_uPb_vBa_wCa_xCu_yO_z \quad (IV)$$

where $1 \leq u \leq 3, 0 \leq v \leq 1, 1 \leq w \leq 2, 2 \leq x \leq 10, 3 \leq y \leq 11, 6 \leq z \leq 35$.

10. A process according to claim 9, wherein in the formula (II), y = x + 1.

11. A process according to claim 9, wherein said firing is carried out at a temperature of 750° C. to 880° C.

12. A process according to claim 11, wherein in the formula (III), $1.5 \leq u' \leq 2.5, 0 \leq v' \leq 0.5, 1.5 \leq w' \leq 2.5, 1.0 \leq x' \leq 2.0, 3.0 \leq y' \leq 4.0, 5.0 \leq z' \leq 17.0$.

13. A process according to claim 9, wherein said calcium compound is added in an amount of 10 to 50 % by weight.

14. A process according to claim 13, wherein said calcium compound is added in an amount of 10 to 20 % by weight.

15. A process according to claim 11, wherein said firing is carried out at a temperature of 840° C. to 880° C.

16. A process according to claim 9, wherein in the formula (III), $1.5 \leq u' \leq 2.5, 0 \leq v' \leq 1, 1.5 \leq w' \leq 2.5, 0 \leq x' \leq 4, 3 \leq y' \leq 8, 3 \leq z' \leq 25$.

* * * * *

UNITED STATES PATENT AND TRADEMARK OFFICE
CERTIFICATE OF CORRECTION

PATENT NO. : 5,049,541

DATED : September 17, 1991

INVENTOR(S) : UZUMAKI et al.

It is certified that error appears in the above-identified patent and that said Letters Patent is hereby corrected as shown below:

Col. 7,      line 1, change "electric" to --electrical--;
               line 18, change "ca$_2$PbO$_4$" to --Ca$_2$PbO$_4$--
               line 55, change "X ray" to --X-ray--;
               line 57, change "The" to --the--;
               line 63, change "AÅ" (both occurrences) to --Å--.

Col. 8,      line 18, change "belo" to --below--;
               line 30, change "." to --:--;
               line 35, after "Jc" insert --,--;
               line 63, change "ca$_2$" to --Ca$_2$--.

Col. 9,      line 3, change "5 mm" to --15 mm--;
               line 28, delete ";";
               line 44, change "amd" to --and--, and change "37 AÅ. the" to --37 Å. The--.

Col. 10,     line 9, change "24 AÅ" to --24 Å--.

Col. 11,     line 8, change "bi$_2$" to --Bi$_2$--;
               line 18, change "electric" to --electrical--;
               line 37, change "a =3 (Example =3" to --a = 2 (Example 5), a = 3--;
               line 53, change "Pb," to --Pb$_v$,--;
               line 55, after "u'" insert --$\leq$--.

Col. 12,     line 35, change "ca$_2$PbO$_3$" to --Ca$_2$PbO$_3$--;
               line 36, change "caO" to --CaO--.

UNITED STATES PATENT AND TRADEMARK OFFICE
CERTIFICATE OF CORRECTION

PATENT NO. : 5,049,541

DATED : September 17, 1991

INVENTOR(S) : UZUMAKI et al.

It is certified that error appears in the above-identified patent and that said Letters Patent is hereby corrected as shown below:

Col. 1,     line 54, after "(x = 3 or 4)" insert --,-- (i.e., a comma);
        line 59, change "stabilize" to --stabilizes--.

Col. 2,     line 66, change "there is also provided" to --the present invention also provides--.

Col. 3,     line 20, after "25" delete ";" and insert --and,--;
        line 28, change "that" to --than--;
        line 44, change ".5" to --40.5--.

Col. 4,     line 52, change "FIG." to --FIGS.--;
        line 57, change "filed" to --field--;
        line 68, change "$C_2Pbo_x$" to --$Ca_2PbO_x$--.

Col. 5,     line 3, chnge "41° C" to --841° C--;
        line 18, delete ",";
        line 25, change "Cuo" to --CuO--;
        line 59, change "(Ca )" to --$(Ca_2PbO_3)$--;
        line 68, after "where" insert --,--.

Col. 6,     line 5, after "CaO" change "." to --,--;
        line 10, delete "in" and change "und" to --and--;
        line 23, change "was rised" to --rose--;
        line 25, change "30 AÅ" to --30 Å--;
        line 27, change "37 AÅ" to --37 Å--;
        line 31, after "4D" insert --.--;
        line 36, change "(ADDOTOPM PF" to --(ADDITION OF--;
        line 37, after "SYSTEM" insert --)--;
        line 38, change "&o" to --to--;
        line 41, change "a&" to --at--;
        line 47, after "wt%" insert --of--;

UNITED STATES PATENT AND TRADEMARK OFFICE
CERTIFICATE OF CORRECTION

PATENT NO. : 5,049,541

DATED : September 17, 1991

INVENTOR(S) : UZUMAKI et al

It is certified that error appears in the above-identified patent and that said Letters Patent is hereby corrected as shown below:

line 53, after "diagram of" insert --the--;
line 59, after "both" delete "and".

Signed and Sealed this

Twentieth Day of July, 1993

Attest:

MICHAEL K. KIRK

Attesting Officer

Acting Commissioner of Patents and Trademarks